(12) United States Patent
Hanzawa et al.

(10) Patent No.: US 11,257,854 B2
(45) Date of Patent: Feb. 22, 2022

(54) PIXEL-LEVEL BACKGROUND LIGHT SUBTRACTION

(71) Applicant: Sony Semiconductor Solutions Corporation, Kanagawa (JP)

(72) Inventors: Katsuhiko Hanzawa, San Jose, CA (US); Jinsuk Kang, Palo Alto, CA (US); Selcuk Sen, Mountain View, CA (US)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 16/644,026

(22) PCT Filed: Aug. 24, 2018

(86) PCT No.: PCT/JP2018/031285
§ 371 (c)(1),
(2) Date: Mar. 3, 2020

(87) PCT Pub. No.: WO2019/049685
PCT Pub. Date: Mar. 14, 2019

(65) Prior Publication Data
US 2020/0350349 A1    Nov. 5, 2020

Related U.S. Application Data

(63) Continuation of application No. 15/699,768, filed on Sep. 8, 2017, now Pat. No. 10,522,578.

(51) Int. Cl.
*H01L 27/146* (2006.01)
*G01S 7/4863* (2020.01)
*G01S 7/487* (2006.01)
*G01S 17/894* (2020.01)
*H01L 27/148* (2006.01)

(52) U.S. Cl.
CPC ...... *H01L 27/14609* (2013.01); *G01S 7/4863* (2013.01); *G01S 7/4876* (2013.01); *G01S 17/894* (2020.01); *H01L 27/1463* (2013.01); *H01L 27/14603* (2013.01); *H01L 27/14645* (2013.01); *H01L 27/14689* (2013.01); *H01L 27/14831* (2013.01)

(58) Field of Classification Search
CPC ......... H01L 27/14609; H01L 27/14603; H01L 27/1463; H01L 27/14645; H01L 27/14689; H01L 27/14831; G01S 17/894; G01S 7/4863; G01S 7/4876
See application file for complete search history.

(56) References Cited

U.S. PATENT DOCUMENTS 10,522,578 B2 * 12/2019 Hanzawa ............. G01S 7/4863
2015/0130902 A1    5/2015 Fossum et al.

* cited by examiner

*Primary Examiner* — Tony Ko
(74) *Attorney, Agent, or Firm* — Michael Best & Friedrich LLP

(57) ABSTRACT

A pixel circuit, a method for performing a pixel-level background light subtraction, and an imaging device are disclosed. In one example of the present disclosure, the pixel circuit includes an overflow gate transistor, a photodiode, and two taps. Each tap of the two taps is configured to store a background signal that is integrated by the photodiode, subtract the background signal from a floating diffusion, store a combined signal that is integrated by the photodiode at the floating diffusion, and generate a demodulated signal based on a subtraction of the background signal from the floating diffusion and a storage of the combined signal that is integrated at the floating diffusion.

21 Claims, 12 Drawing Sheets

PIXEL-LEVEL BACKGROUND LIGHT SUBTRACTION

BACKGROUND OF THE INVENTION

Technical Field

This application relates to circuits and methods for performing a pixel-level background light subtraction including one or more pixel-level background light subtractions.

Background Art

Time-of-flight (TOF) is a technique used in rebuilding three-dimensional (3D) images. The TOF technique includes calculating the distance between a light source and an object by measuring the time for light to travel from the light source to the object and return to a light-detection sensor, where the light source and the light-detection sensor are located in the same device.

Conventionally, an infrared light-emitting diode (LED) is used as the light source to ensure high immunity with respect to ambient light. The information obtained from the light that is reflected by the object may be used to calculate a distance between the object and the light-detection sensor, and the distance may be used to reconstruct the 3D images. The 3D images that are reconstructed may then be used in gesture and motion detection. Gesture and motion detection is being used in different applications including automotive, drone, and robotics, which require more accurate and faster obtainment of the information used to calculate the distance between the object and the light-detection source in order to decrease the amount of time necessary to reconstruct the 3D images.

The level of a typical infrared LED light source is low. This low level causes the sensitivity of the light-detection sensor to also be low and the distance to measure between the object and the light-detection sensor is limited. In some examples, in order to increase the sensitivity of the light-detection sensor, the signal with respect to the light reflected from the object may be accumulated multiple times (referred to herein as "integration"). Additionally, in some examples, the light from the infrared LED is modulated and the entire object is illuminated with the modulated light, where the modulation is done with a clock signal. Since the modulated light from the light source is in the form of a wave, multiple clock signals in different phases are generated to control the light source. The light signal (referred to herein as "demodulated light signal") reflected from the object is captured at the light-detection sensor, for example, a whole sensor array.

In order to calculate the distance from the light source to the object, the demodulated light signal is captured at shifted phases, where the phase difference is driven from the difference in the time-of-flight between the emission of the modulated light from the light source and the reception of the demodulated light signal by the light-detection sensor. An amount of phase shift is calculated from Equation 1.

$$\alpha = \arctan((x1-x3)/(x2-x4)) \quad (1)$$

In some examples, each sample (i.e., each frame out of every four frames) is shifted by ninety degrees (x1 and x3 are quadrature-phased and x2 and x4 are in-phase signals). After subtraction, both the nominator term and denominator term of Equation 1 become independent of offset and background signals. Distance information is obtained from Equation 2.

$$d = C*\alpha/(2*\pi*f) \quad (2)$$

In Equation 2, C is the speed of light and f is the modulation frequency.

As explained above, to increase the sensitivity of the light-detection sensor, the integration time (the accumulation of demodulated light signals for multiple cycles) may be increased to increase the signal-to-noise ratio. By accumulating the demodulated light signals for multiple cycles, the demodulated light signal increases linearly with time while shot noise increases in a square-root of the signal level.

Image sensing devices typically include an image sensor, an array of pixel circuits, signal processing circuitry and associated control circuitry. Within the image sensor itself, charge is collected in a photoelectric conversion device of the pixel circuit as a result of impinging light. Subsequently, the charge in a given pixel circuit is read out as an analog signal, and the analog signal is converted to digital form by an analog-to-digital converter (ADC).

However, the charge generated in the photoelectric conversion device (also referred to as the light-detection sensor or a photodiode) is based on reflected light (for example, the demodulated light) and ambient light (referred to herein as "background light"). The intensity of ambient light in bright sunlight may be many orders of magnitude higher than a magnitude of the reflected light. In some examples, the light received by the light-detection sensor may be bandpass filtered and the background light signal may be limited to a frequency band of interest (e.g., near ~870 nm or near-IR frequency) to increase the signal-to-noise ratio of the photoelectric conversion device. In the example of the photodiode, the maximum capacity of the photodiode is limited by well capacity. A high photocurrent may be generated by the ambient light. The high photocurrent further limits the dynamic range of a difference value of two demodulated light signals, which influences both measurable distances and accuracy of the distance between the object and the light-detection sensor.

SUMMARY OF INVENTION

As described in greater detail below, a comparative light-detection sensor for a TOF application requires an in-pixel comparator and a one shot. However, it is difficult to incorporate both a comparator and a one shot in a single small pixel (for example, a pixel size of approximately five micrometers ($\mu$m)) for several reasons. First, the comparator and one shot require a large pixel area (for example, approximately 30 $\mu$m), which is not suitable for a small pixel. Second, the comparator and one shot require a large amount of power to operate (for example, the comparator may require approximately one microampere ($\mu$A)), which results in high power consumption for a single pixel. For example, extending the 1 $\mu$A across an entire image sensor with a VGA resolution of 640 pixels by 480 pixels, the total current consumption for all of the comparators is approximately 307.2 milliamperes (mA). In some examples, the image sensor uses three volts (V), and the total power consumption for all of the comparators is approximately 921.6 milliwatts (mW). Furthermore, the total power consumption of all of the comparators increases as the resolution of the image sensor increases. Finally, each pixel requires an in-pixel or an external counter to either store the saturation count per tap or store the difference between two phase signals. Accordingly, there exists a need for a light-detection sensor for a TOF application that does not suffer from these and other deficiencies.

Various aspects of the present disclosure relate to a pixel circuit, a method for performing a pixel-level background light subtraction, and an imaging device that includes the pixel circuit. In one aspect of the present disclosure, a pixel circuit includes an overflow gate transistor electrically connected to a node, a photodiode, and two taps. The photodiode is electrically connected to the node and a chassis ground and configured to receive background light, receive a combination of the background light and a demodulated light that is generated by a modulated light source and reflected from an object, integrate a background signal based on the background light that is received, and integrate a combined signal based on the combination of the background light and the demodulated light. Each tap of the two taps is configured to store the background signal that is integrated, subtract the background signal from a floating diffusion, store the combined signal that is integrated at the floating diffusion, and generate a demodulated signal based on a subtraction of the background signal from the floating diffusion and a storage of the combined signal that is integrated at the floating diffusion.

In another aspect of the present disclosure, a method for performing a pixel-level background light subtraction. The method includes integrating, with a photodiode of a pixel circuit, a background signal based on background light received by the photodiode. The method includes storing a charge of the background signal that is integrated in injection capacitors of the pixel circuit. The method includes subtracting the charge that is stored in the injection capacitors from floating diffusions of the pixel circuit. The method includes integrating, with the photodiode, a combined signal based on a combination of background light and demodulated light received by the photodiode. The method includes storing charges of the combined signal in the floating diffusions. The method also includes reading out a demodulated signal from each the floating diffusions, wherein the demodulated signal is a difference between the charge of the combined signal and the charge of the background signal that is stored at the each of the floating diffusions, and wherein the demodulated signal from the each of the floating diffusions has a different phase.

In yet another aspect of the present disclosure, an imaging device includes a controller and an array of pixels. The array of pixels includes at least one pixel circuit that includes an overflow gate transistor electrically connected to a node, a photodiode, and two taps. The photodiode is electrically connected to the node and a chassis ground and configured to receive background light, receive a combination of the background light and a demodulated light that is generated by a modulated light source and reflected from an object, integrate a background signal based on the background light that is received, and integrate a combined signal based on the combination of the background light and the demodulated light. Each tap of the two taps is configured to store the background signal that is integrated, subtract the background signal from a floating diffusion, store the combined signal that is integrated at the floating diffusion, and generate a demodulated signal based on a subtraction of the background signal from the floating diffusion and a storage of the combined signal that is integrated at the floating diffusion.

This disclosure may be embodied in various forms, including hardware or circuits controlled by computer-implemented methods, computer program products, computer systems and networks, user interfaces, and application programming interfaces; as well as hardware-implemented methods, signal processing circuits, image sensor circuits, application specific integrated circuits, field programmable gate arrays, and other suitable forms. The foregoing summary is intended solely to give a general idea of various aspects of the present disclosure, and does not limit the scope of the present disclosure.

BRIEF DESCRIPTION OF DRAWINGS

These and other more detailed and specific features of various embodiments are more fully disclosed in the following description, reference being had to the accompanying drawings, in which.

DESCRIPTION OF EMBODIMENTS

In the following description, numerous details are set forth, such as flowcharts, equations, and circuit configurations. It will be readily apparent to one skilled in the art that these specific details are exemplary and do not to limit the scope of this application.

In this manner, the present disclosure provides improvements in the technical field of time-of-flight sensors, as well as in the related technical fields of image sensing and image processing.

Figure 1:
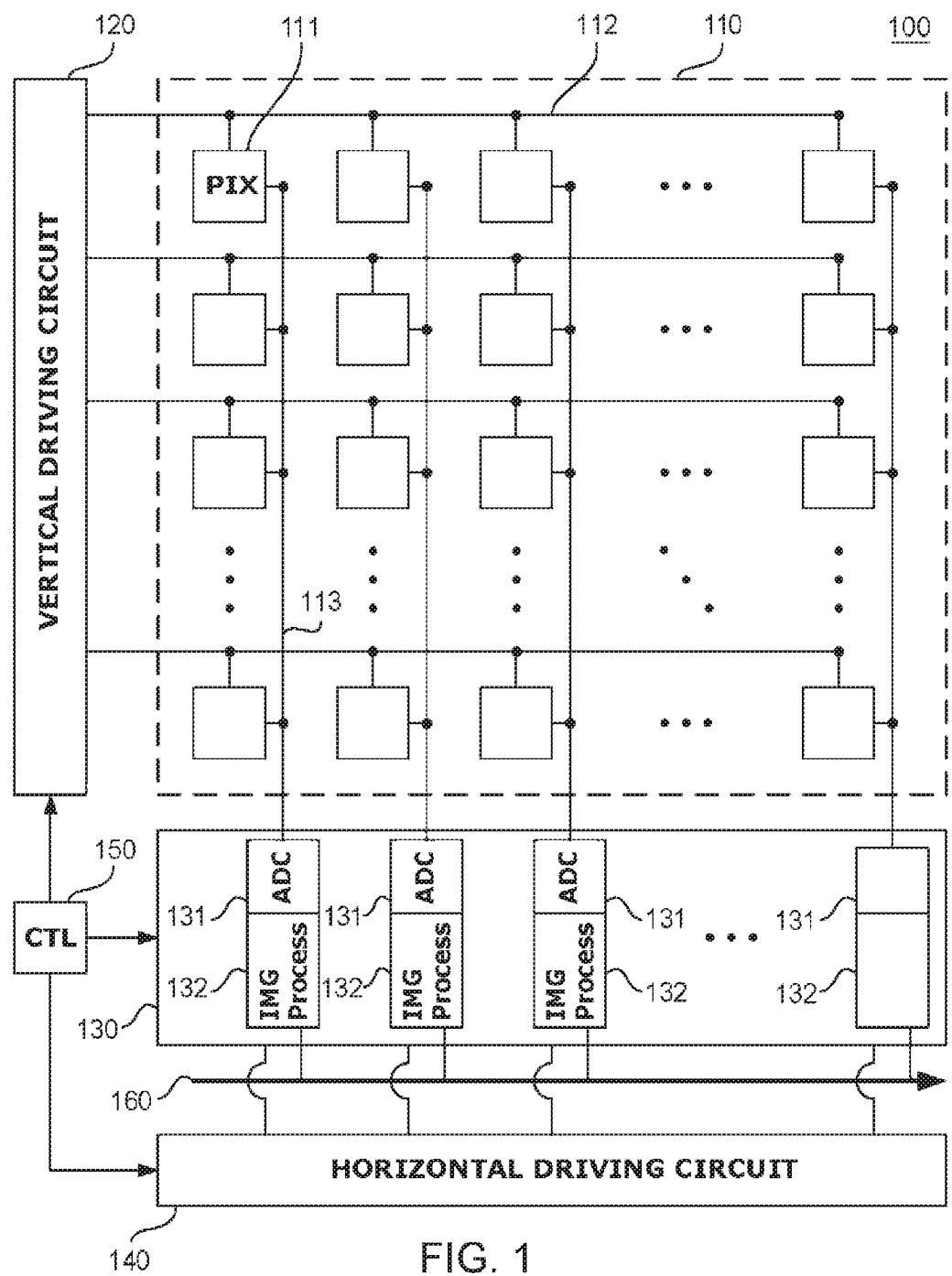
FIG. 1 is a circuit diagram that illustrates an exemplary image sensor, in accordance with various aspects of the present disclosure.

FIG. 1 illustrates an exemplary image sensor 100, in accordance with various aspects of the present disclosure. The image sensor 100 includes an array 110 of pixels 111 located at intersections where horizontal signal lines 112 and vertical signal lines 113 cross one another. The horizontal signal lines 112 are operatively connected to a vertical driving circuit 120 (for example, a row scanning circuit) at a point outside of the array 110. The horizontal signal lines 112 carry signals from the vertical driving circuit 120 to a particular row of the array 110 of pixels 111. The pixels 111 in a particular column output an analog signal corresponding to an amount of incident light to the pixels in the vertical signal line 113. For illustration purposes, only a small number of the pixels 111 are actually shown in FIG. 1. In some examples, the image sensor 100 may have tens of millions of pixels 111 (for example, "megapixels" or MP) or more.

The vertical signal line 113 conducts the analog signal for a particular column to a column circuit 130. In the example of FIG. 1, one vertical signal line 113 is used for each column in the array 110. In other examples, more than one vertical signal line 113 may be provided for each column. In yet other examples, each vertical signal line 113 may correspond to more than one column in the array 110. The column circuit 130 may include one or more individual analog to digital converters (ADC) 131 and image processing circuits 132. As illustrated in FIG. 1, the column circuit 130 includes an ADC 131 and an image processing circuit 132 for each vertical signal line 113. In other examples, each set of ADC 131 and image processing circuit 132 may correspond to more than one vertical signal line 113.

The column circuit 130 is at least partially controlled by a horizontal driving circuit 140 (for example, a column scanning circuit). Each of the vertical driving circuit 120, the column circuit 130, and the horizontal driving circuit 140 receive one or more clock signals from a controller 150. The controller 150 controls the timing and operation of various image sensor components.

In some examples, the controller 150 controls the column circuit 130 to convert analog signals from the array 110 to digital signals. The controller 150 may also control the column circuit 130 to output the digital signals via signal lines 160 to an output circuit for additional signal processing, storage, transmission, or the like. In some examples, the controller 150 includes an electronic processor (for example, one or more microprocessors, one or more digital signal processors, application specific integrated circuits (ASIC), field programmable gate arrays (FPGA), or other suitable processing devices) and a memory.

Additionally, the column circuit 130 may perform various signal processing methods. For example, one or more of the image processing circuits 132 may be controlled by the electronic processor of the controller 150 to perform the various signal processing methods and output the processed signals as the digital signals via the signal lines 160 to an output circuit for additional signal processing, storage, transmission, or the like. In some examples, the electronic processor of the controller 150 controls the memory of the controller 150 to store the digital signals generated by the various signal processing methods. In some examples, the memory of the controller 150 is a non-transitory computer-readable medium that includes computer readable code stored thereon for performing the various signal processing methods. Examples of a non-transitory computer-readable medium are described in greater detail below.

Alternatively, in some examples, image processing circuits (for example, one or more microprocessors, one or more digital signal processors, application specific integrated circuits (ASIC), field programmable gate arrays (FPGA), or other suitable processing devices) that are external to the image sensor 100 may receive the digital signals and perform the various signal processing methods. Additionally or alternatively, the image processing circuits that are external to the image sensor 100 may retrieve the digital signals from the memory of the controller 150 that stores the digital signals and perform the various signal processing methods.

Figure 2:
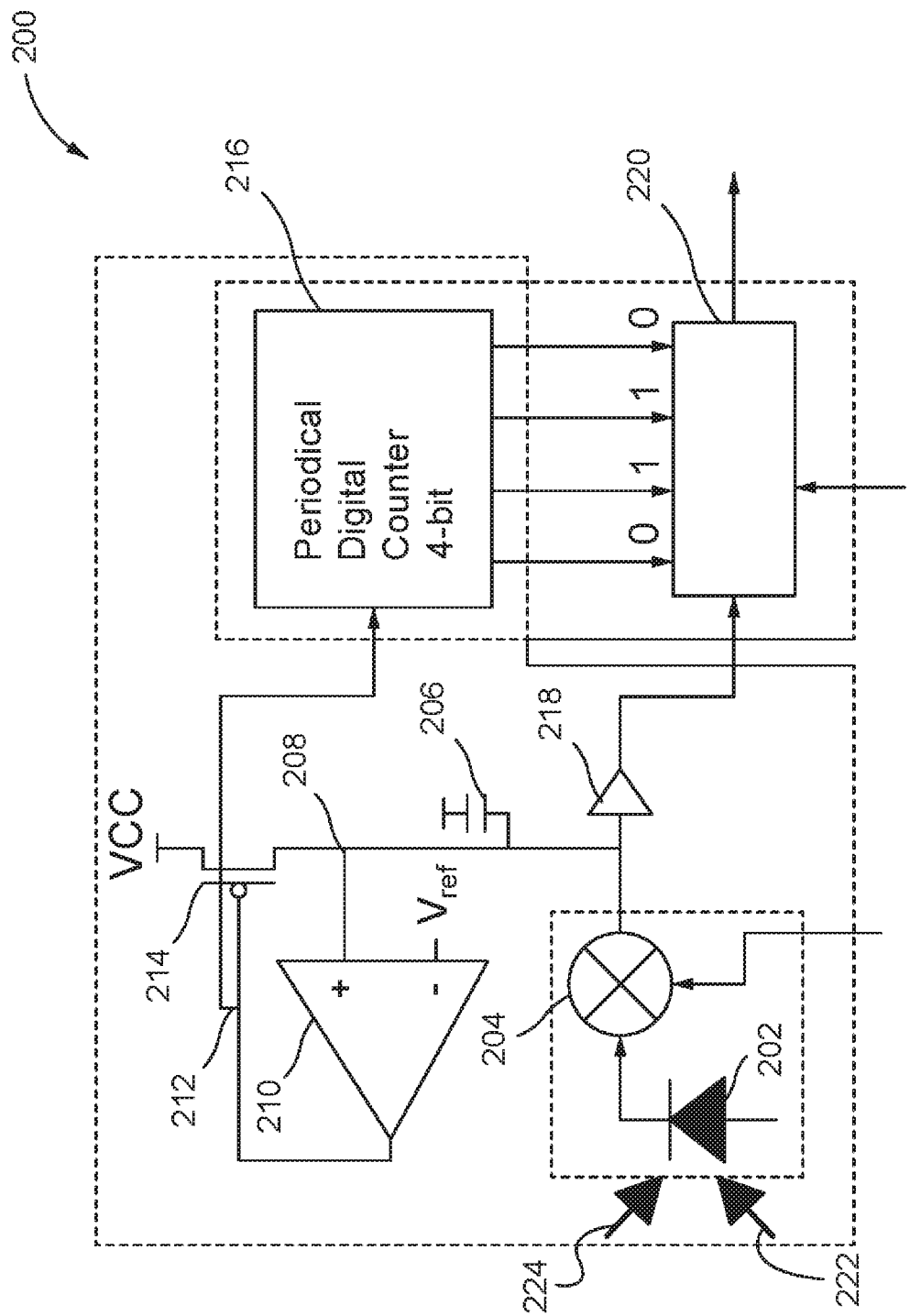
FIG. 2 is a circuit diagram that illustrates a comparative example of a pixel circuit.

FIG. 2 illustrates a comparative example of a pixel circuit 200. The pixel circuit 200 includes a photodiode 202, a mixer 204, an integration capacitor 206, an integration node 208, a comparator 210, a reset node 212, a reset switch 214, a digital counter 216, a driver 218, and an electronic processor 220.

The photodiode 202 receives background light 222 from ambient light sources (not shown) and demodulated light 224 from an object that reflects light from a modulated light source (not shown). The photodiode 202 generates a background light photocurrent based on the background light 222 and a demodulated light photocurrent based on the demodulated light 224.

The mixer 204 receives the background light photocurrent and the demodulated light photocurrent from the photodiode 202. The mixer 204 also receives the modulated light signal used from the modulated light source. The mixer 204 mixes the background light photocurrent, the demodulated light photocurrent, and the modulated light signal and outputs a mixed signal to the integration capacitor 206 and the integration node 208.

Over time, the voltage of the integration capacitor 206 and the integration node 208 increases from the output of the mixed signal by the mixer 204. The comparator 210 compares the voltage of the integration capacitor 206 and the integration node 208 to a reference voltage (VREF). Once the voltage of the integration capacitor 206 and the integration node 208 meets or exceeds the reference voltage, the comparator 210 outputs a reset pulse to the reset node 212 and the reset switch 214. In some examples, the comparator 210 may include a one shot circuit that generates the reset pulse.

The reset switch 214 receives the reset pulse from the comparator 210 via the reset node 212. The reset switch 214 applies a reset voltage (for example, voltage Vcc) to reduce the voltage of the integration capacitor 206 and the voltage of the integration node 208 in response to receiving the reset pulse.

The digital counter 216 receives the reset pulse from the comparator 210 via the reset node 212. The digital counter 216 is incremented in response to receiving the reset pulse.

After the integration time (e.g., accumulation of the demodulated light 224 over multiple cycles), the voltage from the integration capacitor 206 is sampled and added to a differential voltage calculated from a total number of resets (for example, the output of the digital counter 216 multiplied by the reset voltage or voltage Vcc). In some examples, an analog storage capacitor may be used instead of the digital counter 216.

As illustrated in FIG. 2, the pixel circuit 200 requires an in-pixel analog comparator (for example, the comparator 210 in order to compare the integrated voltage (the voltage of the integration capacitor 206 and the integration node 208) to the reference voltage. The pixel circuit 200 also requires the digital counter 116 to maintain the subtracted information, in order to keep the reset counts for each integration node and integration capacitor.

As explained above, when the reset pulse resets the voltage of the integration node 208, the reset voltage also increments the digital counter 216. This technique allows for the subtraction of the background light 222 repeatedly during a single integration period. However, although the background light 222 is subtracted, the shot noise resulting from the background light 222 is not subtracted, but rather, integrated over time with the voltage based on the demodulated light 224. Accordingly, while the signal level of a signal based on the demodulated light 224 increases linearly, the shot noise will increase in a square root of the signal level of a signal based on the background light 222. Additionally, due to the number of circuits required in the pixel circuit 200 (for example, the comparator, the one shot, and counter) and the power needed to operate the circuits, the pixel circuit 200 is not suitable for applications that require a small pixel area and low power consumption (for example, less than 921.6 mW). In other words, the pixel circuit 200 is not suitable for an image sensor in a mobile device.

Figure 3:
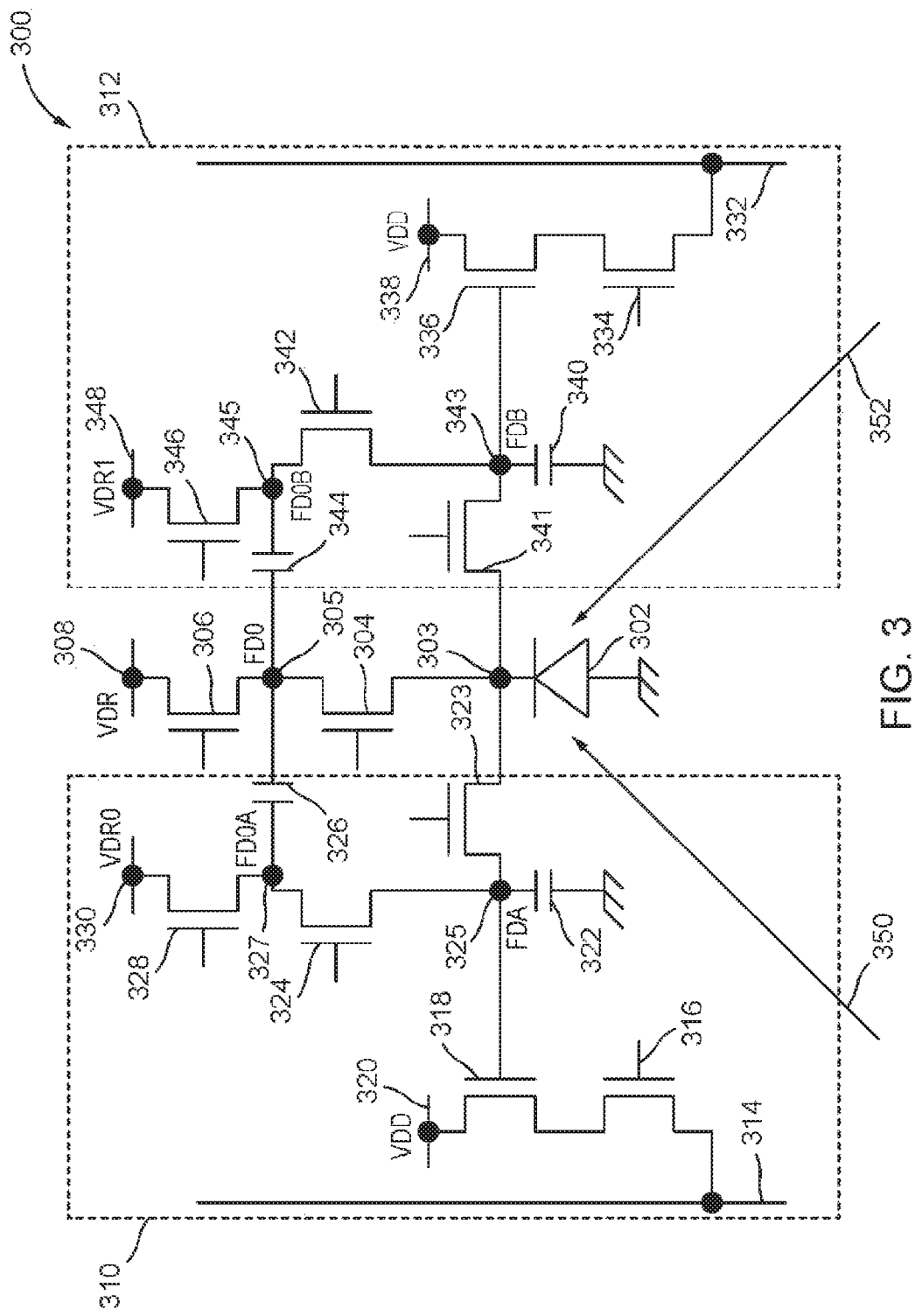
FIG. 3 is a circuit diagram illustrates a pixel circuit, in accordance with various aspects of the present disclosure.

FIG. 3 illustrates a pixel circuit 300. With respect to FIG. 1, the pixel circuit 300 is one pixel of the array 110 of pixels 111 in the image sensor 100, for example, a Floating Diffusion Global Shutter (FDGS) sensor.

In the example of FIG. 3, the pixel circuit 300 includes a photodiode 302, a first common node 303, an overflow gate transistor 304, a second common node 305, a CMR transistor 306, a common supply voltage 308, a first tap 310, and a second tap 312. The overflow gate transistor 304 is connected to the photodiode 302 at the first common node 303 and resets the photodiode 302 globally independent of a normal readout path the transfer gate. Since the first tap 310 and the second tap 312 share the photodiode 302, only a single overflow gate transistor is used in the pixel circuit 300.

The first tap 310 includes a first vertical signal line 314, a first selection transistor 316, a first amplification transistor 318, a first supply voltage 320, a first floating diffusion capacitor 322, a first floating diffusion transistor 323, a first injection switch 324, a first floating diffusion node 325, a first injection capacitor 326, a first injection node 327, a first reset switch 328, and a first reset voltage supply 330. The first vertical line 314 is electrically connected to the column circuit 130. A source side of the first selection transistor 316 is electrically connected to the first vertical signal line 314, a drain side of the first selection transistor 316 is electrically connected to a source side of the first amplification transistor 318, and a gate of the first selection transistor 316 is electrically connected to the electronic controller 150 via one of the horizontal signal lines 112 and the vertical driving circuit 120. A drain side of the first amplification transistor 318 is electrically connected to the first supply voltage 320. A gate of the first amplification transistor 318, one end of the first floating diffusion capacitor 322, one end of the first floating diffusion transistor 323, and one end of the first injection switch 324 are electrically connected to the first floating diffusion node 325. The other end of the floating diffusion capacitor 322 is electrically connected to ground. The other end of the first floating diffusion switch 323 is electrically connected to the first common node 303 and one end of the photodiode 302. The other end of the first injection switch 324, one end of the first injection capacitor 326, and one end of the first reset switch 328 are electrically connected to the first injection node 327. The other end of the first injection capacitor 326 and a drain side of the overflow gate transistor 304 are electrically connected to the second common node 305. The other end of the first reset switch 328 is electrically connected to the first reset voltage supply 330.

The second tap 312 includes a second vertical signal line 332, a second selection transistor 334, a second amplification transistor 336, a second supply voltage 338, a second floating diffusion capacitor 340, a second floating diffusion transistor 341, a second injection switch 342, a second floating diffusion node 343, a second injection capacitor 344, a second injection node 345, a second reset switch 346, and a second reset voltage supply 348. The second tap 312 mirrors the first tap 310. As a consequence, the electrical connections of the second tap 312 mirrors the first tap 310, and therefore, a description of the electrical connections of the second tap 312 is omitted.

The photodiode 302 receives demodulated light 350 and background light 352. Over the course of various time periods, as explained in greater detail below, the photodiode 302 provides a charge based on the demodulated light 350 and the background light 352 to the two injection capacitors 326 and 344 and to the two floating diffusion capacitors 322 and 340 for storage and integration. In particular, the two injection capacitors 326 and 344 are used to store the charge from the photodiode 302, which is integrated from a background signal based on the background light 352, when the light source that emits a modulated light is turned off. Alternatively, in some examples, the two injection capacitors 326 and 344 may store a charge that is manually inserted externally (for example, a charge from the controller 150). During the subtraction of the background signal (described in greater detail below), the charge that is stored by the two injection capacitors 326 and 344 is injected into the corresponding two floating diffusion capacitors 322 and 340 through a serial circuit connection when the two injection switches 324 and 342 are turned on.

Conversely, when the two injection switches 324 and 342 are turned off, the two injection switches 324 and 342 are used to isolate the two floating diffusion capacitors 326 and 344 from the two injection capacitors 326 and 344 while the pixel circuit 300 integrates either the background signal or a combined signal based on an integration of the demodulated light 350 and the background light 352, as described in greater detail below. The only periods of time that the two injection switches 324 and 342 are turned on is during a reset time period and a background signal subtraction time period. Accordingly, the two injection switches 324 and 342 isolate the two injection capacitors 326 and 344 to reset and recharge without affecting the integration of the combined signal and enables multiple integrations of the background signal and multiple subtractions of the background signal from the combined signal.

Figure 4:
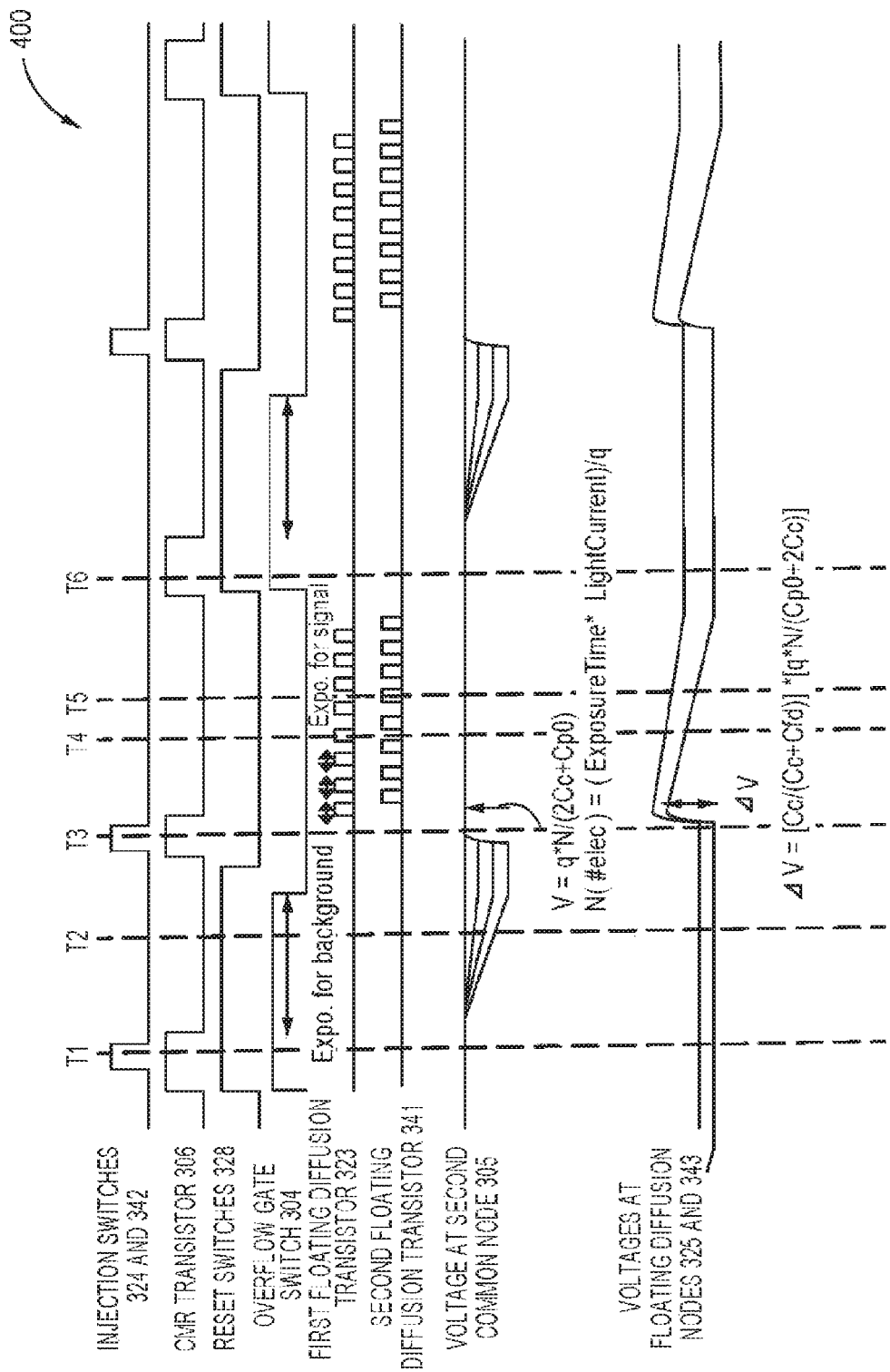
FIG. 4 is a timing diagram that illustrates operations of the pixel circuit of FIG. 3, in accordance with various aspects of the present disclosure.

FIG. 4 is a timing diagram 400 that illustrates operations of the pixel circuit 300 of FIG. 3. The timing diagram 400 shows that, during the middle of integrating the combined signal, the background signal is integrated and subtracted from the integration of the combined signal, which is based on a combination of both the background light 352 and the demodulated light 350.

During a first time period T1, the photodiode 302 is in a reset phase for integration of the background signal based on the background light 352. The photodiode 302 is reset through the CMR switch 306, the OFG switch 304, the two reset switches 328 and 346, and the two injection switches 324 and 342. Additionally, the two floating diffusion switches 323 and 341 are turned off. By turning off the two injection switches 324 and 342 and the two floating diffusion switches 323 and 341, the two floating diffusion capacitors 322 and 340 are isolated and not affected by the integration of the background signal occurring at the two injection capacitors 326 and 344. During the first time period T1, the light source that emits the modulated light is also turned off or remains off. By turning off or keeping off the light source, the integration of the background signal occurring at the two injection capacitors 326 and 344 is only based on the background light 352. In the example of FIG. 4, the reset voltage of the photodiode 302 is determined by a voltage of the common reset voltage supply 308.

During a second time period T2, the CMR switch 306 is turned off and the OFG switch 304 remains on. A charge with respect to the background light 352 is integrated in the photodiode 302 and is transferred to the two injection capacitors 326 and 344. Additionally, the two reset switches 328 and 346 remain ON and one end of the two injection capacitors 326 and 344 remain connected to the two reset voltage supplies 330 and 348 and hold the potential to the reset voltage. The charge from the integration of the background light 352 in the photodiode 302 is shared and stored in the two injection capacitors 326 and 344 until the pixel circuit 300 is ready to subtract the charge from a charge that is based on a combination of the background light 352 and the demodulated light 350. During the second time period T2, the light source that emits modulated light remains turned off.

During a third time period T3, the CMR switch 306 is turned on to start the subtraction of the charge from the integration of the background light 352 from the charge that is based on the integration of the background light 352 and the demodulated light 350. By turning on the CMR switch 306, voltages at the two injection nodes 327 and 345 are boosted by a voltage of the common reset voltage supply 308 ($V_{DR}$). The amount of boosting voltage is determined by a difference between the voltage of the common reset voltage supply 308 and the charge stored in the two injection capacitors 326 and 344 ($V_{FDO}$), that is, $V_{DR}$-$V_{FDO}$. Additionally, during the third time period T3, the two injections switches 324 and 342 are turned on. By turning on the two injection switches 324 and 342, the boosted voltage injects the charge stored in the two injection capacitors 326 and 344 into the two floating diffusion nodes 325 and 343. During the third time period T3, the two floating diffusion switches 323 and 341 remain off. The amount of charge injected into each of the two floating diffusion nodes 325 and 343 is based on a ratio of capacitances of each injection capacitor (e.g., either the first injection capacitor 326 or the second injection capacitor 344) and corresponding injection node (e.g., the corresponding first injection node 327 or the corresponding second injection node 345). With respect to the first tap 310, the amount of charge is defined by Equation 3.

$$\text{Amount of charge} = C_{326}(C_{322}+C_{326})*(V_{DR}-V_{FDO}) \quad (3)$$

In Equation 3, $C_{326}$ is the capacitance of the first injection capacitor 326, $C_{322}$ is the capacitance of the first floating diffusion capacitor 322, $V_{DR}$ is the voltage of the common reset voltage supply 308, and $V_{FDO}$ is the charge accumulated at the first injection node 327.

During fourth and fifth time periods T4 and T5, once the injection of the charge stored in the two injection capacitors 326 and 344 is complete, the two injection switches 324 and 342 are turned off and the integration of the combination of the demodulated light 350 and the background light 352 starts or resumes by alternatively providing pulses to turn on the two floating diffusion switches 323 and 341. The light source that emits modulated light is also turned on and synchronized with the alternately provided pulses to the two floating diffusion switches 323 and 341. Additionally, the photodiode 302 receives the demodulated (reflected) light 350 and the background light 352 and converts the light that is received into an electrical charge (referred to herein as "a combined charge or a combined signal") at the first common node 303. Since the two floating diffusion transistors 323 and 341 are alternately turning on, the two floating diffusion nodes 325 and 343 integrate the combined charge at phases that are opposite to each other.

During a sixth time period T6, when the signal level of the two floating diffusion nodes 325 and 343 after subtraction of the background signal (for example, the operation performed during T3) still has some headroom for further signal integration, the operations performed during the second through fifth time periods T2-T5 are repeated until the signal level of the two floating diffusion nodes 325 and 343 is close to the saturation level of the two floating diffusion nodes 325 and 343. The resultant charge (i.e., a charge based primarily on the demodulated light 350) is kept in the two floating diffusion nodes 325 and 343 until the completion of the readout by the controller 150 via one of the vertical scan lines 113 and the column circuit 130 as described above in FIG. 1, and the next horizontal time period starts.

One of the many advantages of the pixel circuit 300 is the isolation provided by the two injection switches 324 and 342. By isolating the two floating diffusion nodes from the two injection capacitors 326 and 344 with the two injection switches 324 and 342, the two floating diffusion nodes do not need to be reset after each integration of the background signal that is based on the background light 352. In other words, the pixel circuit 300 may halt the integration of the combined signal at any time, perform the integration of the background signal, and resume the integration of the combined signal. Additionally or alternatively, in some examples, the pixel circuit 300 may halt the capture of the combined signal at any time, perform the integration of the background signal, and subtract the current integration of the background signal from the combined signal before resuming the integration of the combined signal.

In the example of FIG. 4, the pixel circuit 300, a single pixel in the array 110 of the pixels 111 of FIG. 1, integrates the background signal based on the background light 352. With respect to FIG. 1, as all background signal integration is performed on a per pixel basis, the resultant signal level of the background signal will be different from pixel to pixel. However, the same integrated background signal from the photodiode 302 will be subtracted from both the first tap 310 and the second tap 312 because both the first and second taps 310 and 312 share the photodiode 302. Another of the many advantages of the pixel circuit 300 is the integration and subtraction of the background signal for all the pixels 111 in the array 110 is done globally. By performing the integration and subtraction of the background signal globally, there is no artifact caused due to the processing time lag among the array 110 of pixels 111.

Upon completing the integration cycle, the voltage stored in each of the two floating diffusion nodes 325 and 343 is read out by the vertical driving circuit 120 and digitally processed by the column circuit 130. Information regarding both in-phase and quadrature phase signals (or other phase signals in between, if more than four phase signals are implemented) is extracted (for example, extracted by the controller 150 or an external electronic processor) from the voltages that are read out from the pixel circuit 300. The information that is readout is used to calculate the distance from the light source to the object or from the object to the pixel circuit 300 based on Equations 1 and 2 as described above.

Figure 5:
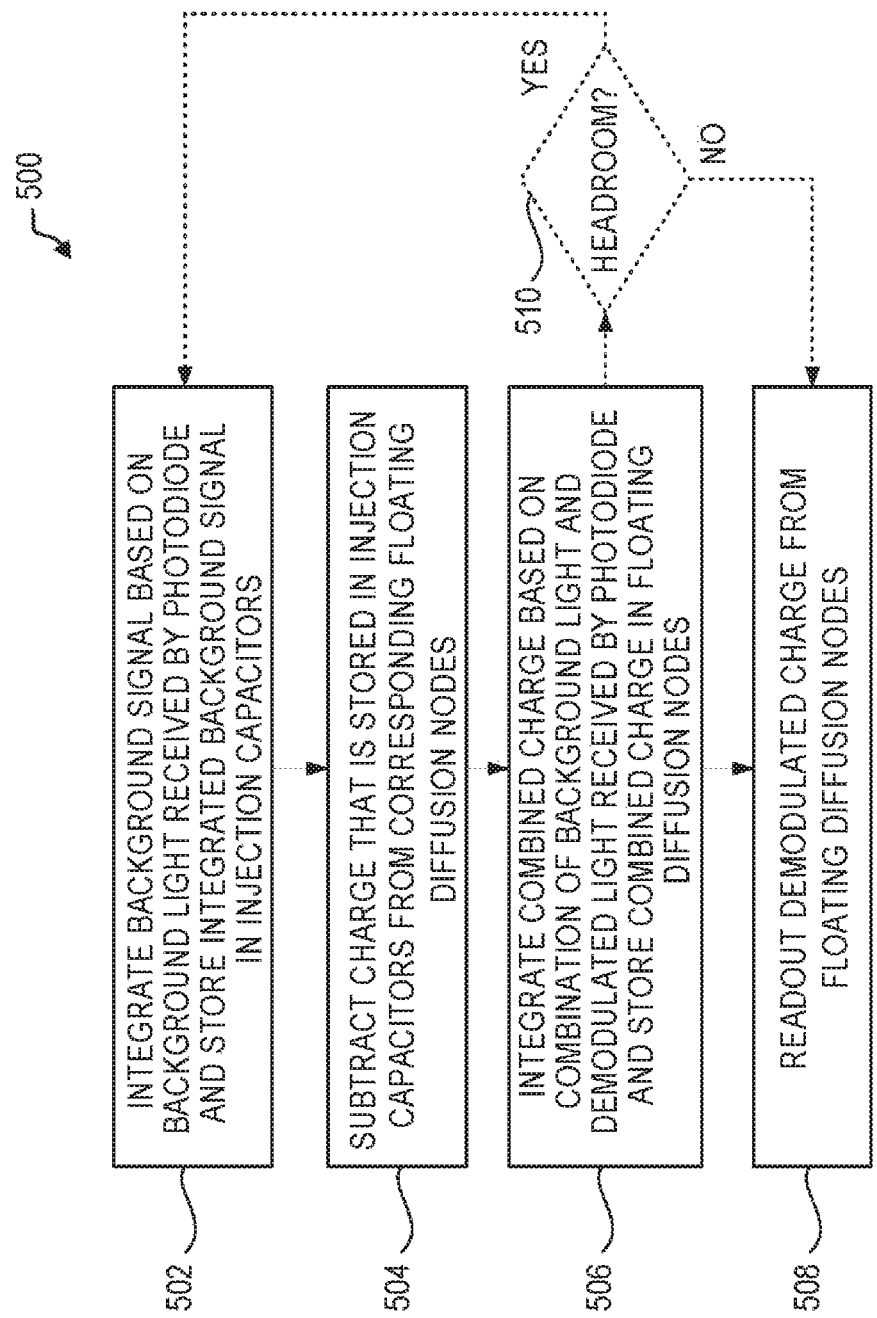
FIG. 5 is a flowchart that illustrates a method performed by the pixel circuit of FIG. 3, in accordance with various aspects of the present disclosure.

FIG. 5 is a flowchart that illustrates a method 500 performed by the pixel circuit 300 of FIG. 3, in accordance with various aspects of the present disclosure. The method 500 includes integrating the background signal based on the background light 352 that is received by the photodiode 302 (block 502). Specifically, the background signal is integrated by the photodiode 302 and transferred to the two injection capacitors 326 and 344. The charge from integration of the background signal at the photodiode 302 is shared and stored in the two injection capacitors 326 and 344 until the pixel circuit 300 is ready to subtract the charge from a charge that is based on an integration of the background light 352 and demodulated light 350. While the photodiode 302 integrates the background signal, the light source that emits the modulated light 350 remains off. By keeping the light source off, the integration of the background signal at the photodiode 302 is based only on the background light 352.

The method 500 includes subtracting the charge of the background signal that is stored in the two injection capacitors 326 and 344 from the two floating diffusion nodes 325 and 343 (block 504). During the subtraction of the charge of the background signal, the CMR switch 306 is turned on, and voltages at the two injection nodes 327 and 345 are boosted by a voltage of the common reset voltage supply 308 ($V_{DR}$). Additionally, during the subtraction of the charge of the background signal, the two injection switches 324 and 342 are turned on, and the boosted voltage is used to inject the charge that is stored in the two injection capacitors 326 and 344 into the corresponding two floating diffusion nodes 325 and 343 through the two injection switches 324 and 342.

The method 500 includes integrating a combined charge based on the demodulated light 350 and the background light 352 received by the photodiode 302 and store the combined charge in the two floating diffusion nodes 325 and 343 (block 506). Once the injection of the charge that is stored in the two injection capacitors 326 and 344 is complete, the two injection switches 324 and 342 are turned off and the integration of the combined charge either starts or resumes by alternatively providing pulses to turn on the two floating diffusion switches 323 and 341. The light source that emits the modulated light is also turned on and synchronized with the alternately provided pulses to the two floating diffusion switches 323 and 341. The photodiode 302 receives the demodulated (reflected) light 350 and the background light 352 and converts the light into the demodulated electrical charge due to the subtraction of the charge of the background signal at the first common node 303. Since the two floating diffusion transistors 323 and 341 are alternately turning on, the two floating diffusion nodes 325 and 343 integrate the combined charges at phases that are opposite to each other.

The method 500 includes reading out the demodulated charge from each of the two floating diffusion nodes 325 and 343 (block 508). Optionally, in some examples, the method 500 also includes a headroom determination (decision block 510) prior to reading out the demodulated charge from each of the two floating diffusion nodes 325 and 343 (block 508). For example, a comparator or an electronic processor (for example, the controller 150) may determine whether the signal level of the demodulated signal after the subtraction of the background signal has headroom for additional signal integration. When the comparator determines that signal level of the demodulated signal has headroom for additional signal integration ("Yes" at decision block 510), the method 500 is repeated until the signal level of the demodulated signal is close to the saturation level of the two floating diffusion nodes 325 and 343. The resultant demodulated charge is kept in the two floating diffusion nodes 325 and 343 until the completion of the readout by the controller 150 (block 508).

When the comparator determines that signal level of the demodulated signal does not have headroom for additional signal integration ("No" at decision block 510), the method 500 is not repeated. The resultant demodulated charge is kept in the two floating diffusion nodes 325 and 343 until the completion of the readout by the controller 150 (block 508).

In some examples, the method 500 includes resetting the photodiode 302 before integrating the background signal based on background light received by the photodiode 302 (i.e., before block 502). Specifically, the photodiode 302 of the pixel circuit 300 is reset by turning on the CMR switch 306, the OFG switch 304, and the two reset switches 328 and 346. Additionally, during the reset operation, a light source that emits the modulated light is turned off or remains off.

In some examples, the method 500 does not reset the two floating diffusion nodes 325 and 344 to maintain the demodulated charge stored in each floating diffusion node. Therefore, even in the middle of integration of the demodulated signal, after halting the capture and integration of the demodulating signal, a cycle to boost the background signal may be performed since the demodulated charge in each floating diffusion node is maintained. This maintenance of the demodulated charge in each floating diffusion is possible due to the two injection switches 324 and 342, which isolate the two injection capacitors 326 and 344 from the two floating diffusion nodes 325 and 343 and keep the demodulated charges stored in the two floating diffusion nodes 325 and 343 unaffected during the integration of the background signal.

Figure 6:
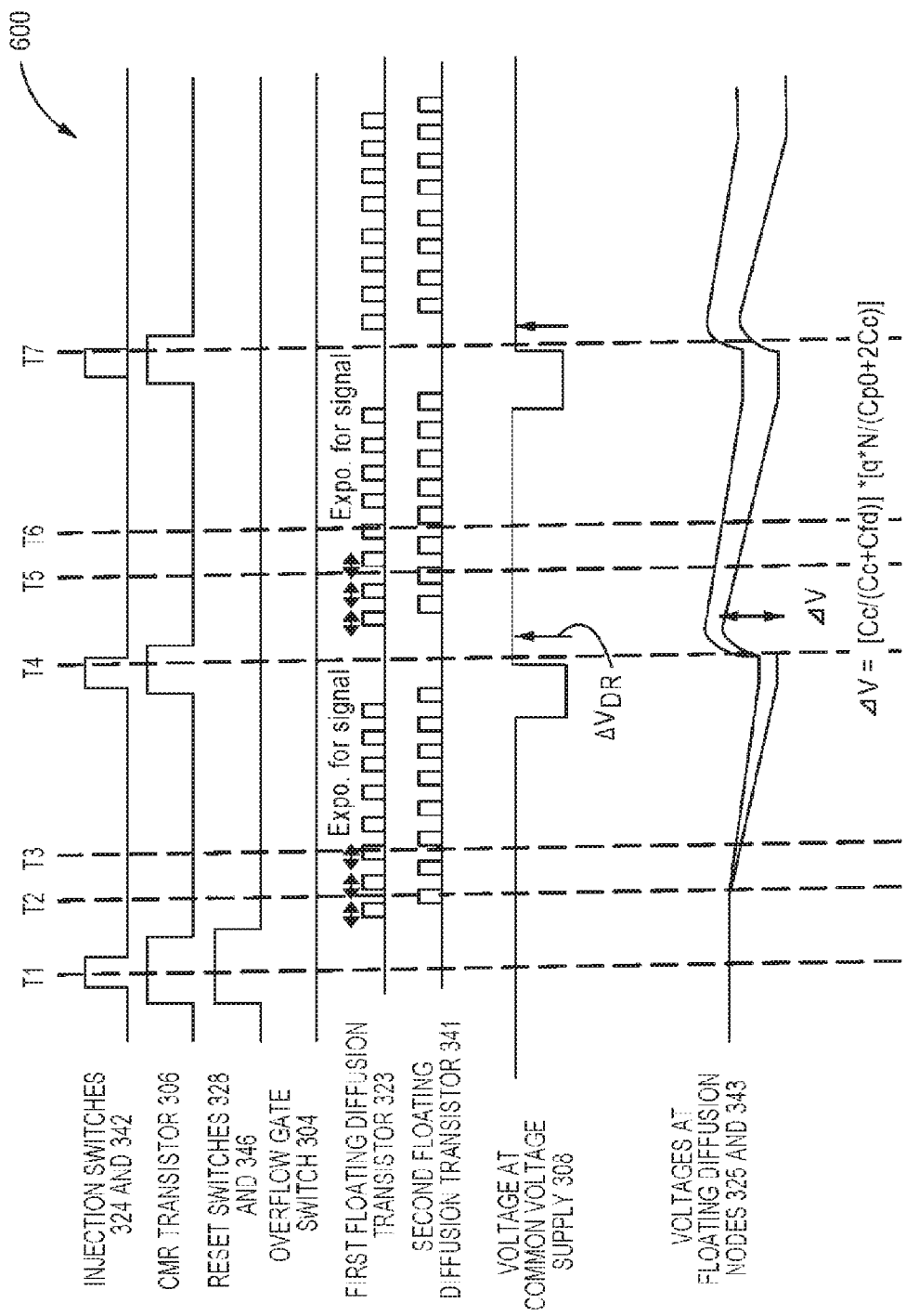
FIG. 6 is another timing diagram that illustrates operations of the pixel circuit of FIG. 3, in accordance with various aspects of the present disclosure.

FIG. 6 is another timing diagram 600 that illustrates operations of the pixel circuit 300 of FIG. 3, in accordance with various aspects of the present disclosure. In the timing diagram 600, the background signal is not integrated in the current frame of interest. In the example of FIG. 6, minimum and maximum levels of the background signals are predetermined in the frame prior to the frame of interest for which the time-of-flight determination is performed. The background signal data captured from the previous frame is readout and analyzed to get the minimum and maximum values of the background signal. By determining the minimum and maximum values from the previous frame readout, all of the pixels will fall into the range between the minimum and maximum values, and the subtraction of the background signal will be made globally across all of the pixels, rather than a pixel-by-pixel basis.

In some examples, an average of the minimum and maximum values may be subtracted from the two floating diffusion nodes 325 and 343 at the same time for all the pixels. In other examples, a value between the minimum and maximum values may be used, the value being selected based on a minimum amount of time required for the two floating diffusion nodes 325 and 343 of the pixel circuit 300 to reach saturation (for example, a predetermined level which is close to the saturation level).

Since the value for the background signal is predetermined, the subtraction of the background signal does not affect the integration of the demodulated signal other than the time period when the two injection switches 324 and 342 are turned on to boost the voltage at the floating diffusion nodes 325 and 343. During the integration of the demodulated signal, the two injection switches 324 and 342 are turned off and the two floating diffusion nodes 325 and 343 are isolated from the two injection capacitors 326 and 344. The subtraction of the background signal may also be repeated as long as the two floating diffusion nodes 325 and 343 are not saturated.

During a first time period T1, the photodiode 302 and the two floating diffusion nodes 325 and 343 are in a reset phase for background signal integration. The photodiode 302 is reset through the CMR switch 306 and the OFG switch 304. The two floating diffusions 325 and 343 are reset by the corresponding two reset switches 328 and 346. In some examples, reset voltages applied by the two reset switches 328 and 346 from the two reset voltage supplies 330 and 348 are the same. In other examples, the reset voltages applied by the two reset switches 328 and 346 from the two reset voltage supplies 330 and 348 are different from each other. In some examples, reset voltages applied by the two reset switches 328 and 346 and the CMR switch 306 from the two reset voltage supplies 330 and 348 and the common reset voltage supply 308, respectively, are the same. In other examples, the reset voltages applied by the two reset switches 328 and 346 and the CMR switch 306 from the two reset voltage supplies 330 and 348 and the common reset voltage supply 308, respectively, are different from each other.

During second and third time periods T2 and T3, integration of the demodulated signal starts or resumes by alternatively providing pulses to turn on the two floating diffusion switches 323 and 341. The light source that emits the modulated light is also turned on and synchronized with the alternately provided pulses to the two floating diffusion switches 323 and 341. Additionally, the photodiode 302 receives the demodulated (reflected) light 350 and the background light 342 and converts the light to a combined electrical charge at the first common node 303. Since the two floating diffusion transistors 323 and 341 are alternately turning on, the two floating diffusion nodes 325 and 343 integrate the combined charges at phases that are opposite to each other.

During a fourth time period T4, a voltage ($V_{DR}$) of the common reset voltage supply 308 is lowered by the voltage increment determined from the previous frame that needs to be subtracted from the two floating diffusion nodes 325 and 343. After lowering the voltage of the common reset voltage supply 308 by the voltage increment, subtraction of the background signal begins by turning on the CMR switch 306 in addition to the two injections switches 324 and 342. By turning on the CMR switch 306, voltages at the two injection nodes 327 and 345 are boosted by the lowered voltage ($V_{DR}$) of the common reset voltage supply 308. By turning on the two injection switches 324 and 342, the boosted voltage injects the charge that stored in the two injection capacitors 326 and 344 into the two floating diffusion nodes 325 and 343 through the two injection switches 324 and 342. During the third time period T3, the two floating diffusion switches 323 and 341 remain off. The amount of charge injected into each of the two floating diffusion nodes 325 and 343 is based on a ratio of capacitances of each injection capacitor and corresponding injection node. With respect to the first tap 310, the amount of charge is defined by Equation 4.

$$\text{Amount of charge} = C_{326}(C_{322}+C_{326})*(V_{DR}) \quad (4)$$

In Equation 4, $C_{326}$ is the capacitance of the first injection capacitor 326, $C_{322}$ is the capacitance of the first floating diffusion capacitor 322, and $V_{DR}$ is the voltage of the common reset voltage supply 308.

During fifth and sixth time periods T5 and T6, the integration of the demodulated signal resumes by alternatively providing pulses to turn on the two floating diffusion switches 323 and 341. The light source that emits the modulated light is also turned on or remains on and is synchronized with the pulses provided to the two floating diffusion switches 323 and 341. Additionally, the photodiode 302 receives the demodulated (reflected) light 350 and the background light 352 and converts the light to a combined electrical charge at the first common node 303. Due to the subtraction of the background signal and the two floating diffusion transistors 323 and 341 alternately turning on, the two floating diffusion nodes 325 and 343 integrate the demodulated charge at phases that are opposite to each other.

During a seventh time period T7, when the signal level of the demodulated signal still has headroom for further signal integration, the operations performed during the fourth through seventh time periods T4-T7 may be repeated until the signal level of the demodulated signal is close to the saturation level of the two floating diffusion nodes 325 and 343. The resultant demodulated charge is kept in the two floating diffusion nodes 325 and 343 until the completion of the readout by the column driving circuit 120, and the next horizontal time period starts.

Upon completing the integration cycle, the voltage stored in each of the two floating diffusion nodes 325 and 343 is read out by the vertical driving circuit 120 and digitally processed by the column circuit 130. Information regarding both in-phase and quadrature phase signals (or other phase signals in between, if more than four phase signals are implemented) is extracted from the voltages that are read out. The information that is extracted (for example, extracted by the controller 150 or an external electronic processor) is used to calculate the distance from the light source to the object or from the object to the pixel circuit 300 based on Equations 1 and 2 as described above.

In the example of FIG. 6, the pixel circuit 300, a single pixel in the array 110 of the pixels 111 of FIG. 1, integrates the background light 352 in a previous frame. As described above, the value (e.g., a correction voltage) of the background signal is determined from a previous frame and subtraction of the value of the background signal is performed on a global basis. In other words, the value of the background signal is common across all of the pixels 111. Accordingly, the pixel circuit 300 may subtract a correction voltage from the two floating diffusion nodes 325 and 343 that is common to all of the pixels 111. The pixel circuit 300 may also subtract the correction voltage simultaneously or nearly simultaneously with respect to all of the pixels 111. By subtracting the correction voltage on a global basis, the time-of-flight operation is faster, simpler, and less subject to the switching noise when compared to subtracting a background signal that is integrated on a per pixel basis as described above in FIG. 4.

In some examples, when the charge of the background signal is forwarded to the two injection nodes 327 and 345, the charge is shared by the source or drain node of the CMR switch 306 and the OFG switch 304 as well as the common node of the two injection capacitors 326 and 344. As the capacitance of the two injection capacitors 326 and 344 increases with respect to the capacitances of the two floating diffusion capacitors 322 and 340, the attenuation of the injection voltage increases at the two floating diffusion nodes 325 and 343.

Stated differently, when the overall capacitance value of each of the two injection nodes 327 and 345 is large, the voltages that are injected into to the two floating diffusion nodes 325 and 343 are largely attenuated. The attenuation of the voltages reduces the signal gain (for example, the conversion gain) of the pixel circuit 300 and limits the range of background signal correction. When the signal gain is low, the time needed to integrate the background signal needs to be increased to keep the background subtraction signal as close as possible to signal gain at the two floating diffusion nodes 325 and 343. Increasing the time needed to integrate the background signal will further increase the frame time.

Figure 7:
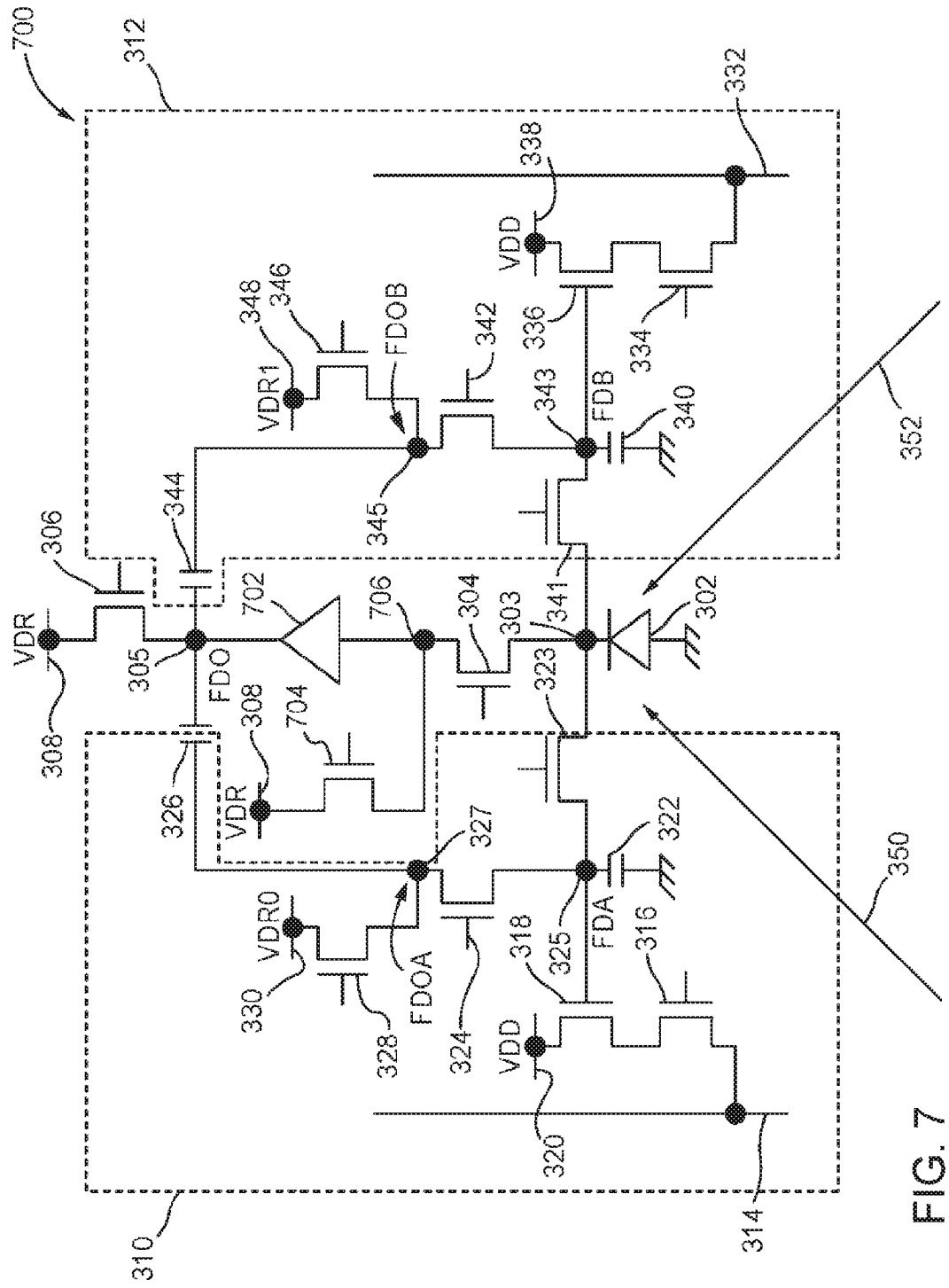
FIG. 7 is a circuit diagram that illustrates another pixel circuit, in accordance with various aspects of the present disclosure.

FIG. 7 illustrates a pixel circuit 700. FIG. 7 is described with respect to FIGS. 1 and 3. In the example of FIG. 7, the pixel circuit 700 includes components that are similar to the components of the pixel circuit 300 (referenced by similar reference numerals). Additionally, in the example of FIG. 7, the pixel circuit 700 also includes an analog buffer 702 located in between the OFG switch 304, a GRS switch 704 connected at a GRS node 706, the second common node 305, and one end of the two injection capacitors 324 and 342. The analog buffer 702 will isolate the GRS node 706 from the two injection capacitors 324 and 342. The isolation of the GRS node 706 keeps the node capacitance of the GRS node 706 much lower than the node capacitance of the second common node 305, and increases the overall voltage gain of the integrated background signal. The GRS switch 704 is used to globally reset the photodiode 302 for both the background signal and reflected LED signal integrations. Stated differently, the GRS switch 704 is used to reset the GRS node, which resets the photodiode 302 via the OFG switch 304.

Figure 8:
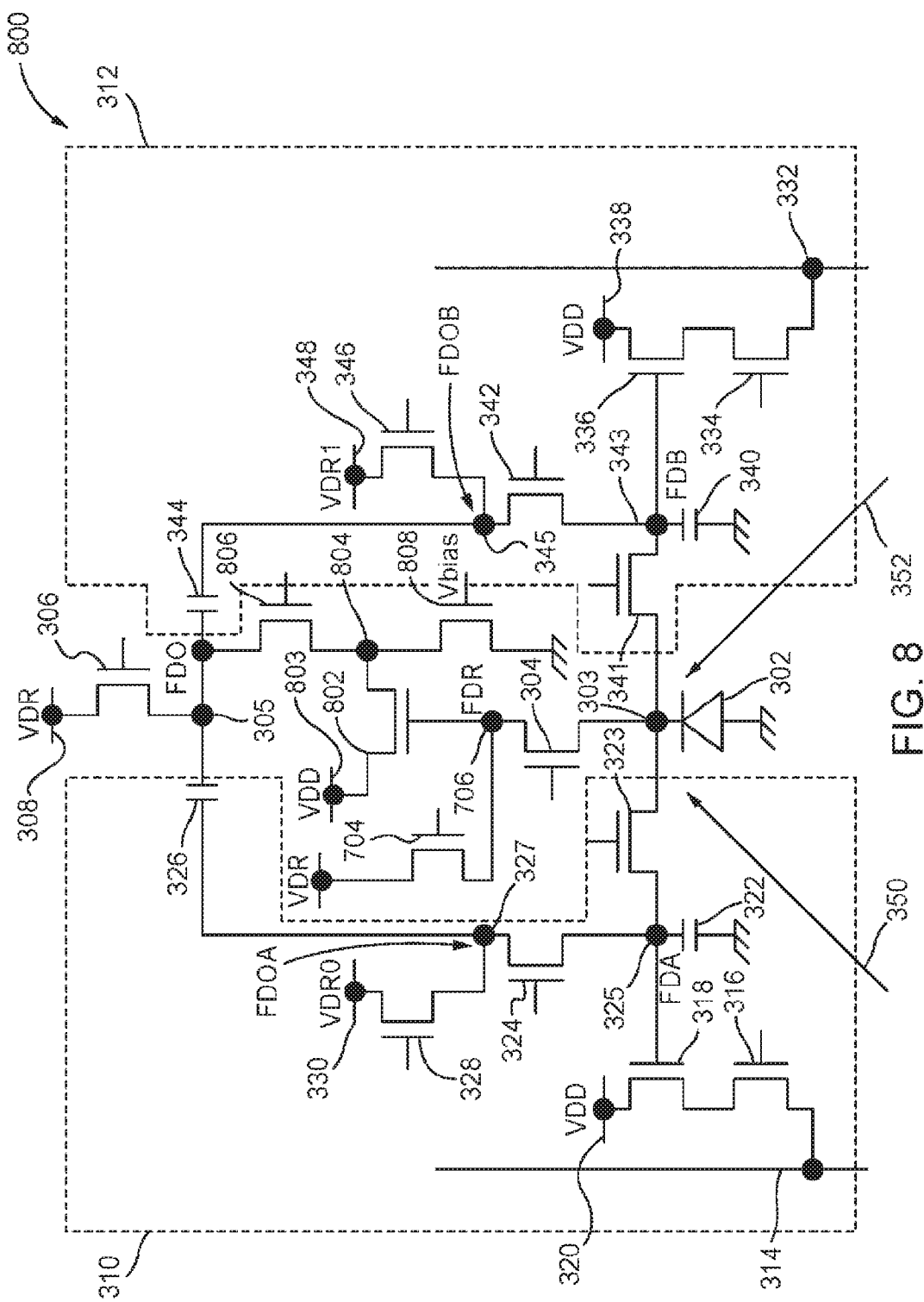
FIG. 8 is a circuit diagram that illustrates yet another pixel circuit, in accordance with various aspects of the present disclosure.

FIG. 8 illustrates a pixel circuit 800. FIG. 8 is described with respect to FIGS. 1, 3, and 7. In the example of FIG. 8, the pixel circuit 800 includes components that are similar to the components of the pixel circuitries 300 and 700 (referenced by similar reference numerals). Specifically, in the example of FIG. 8, the pixel circuit 800 includes a CSF transistor 802, a CMA switch 806, and a bias voltage switch 808 in place of the analog buffer 702 as described above in FIG. 7. The CSF transistor 802 is located in between the OFG switch 304, the GRS switch 704 connected at the GRS node 706, and the CSF node 804. The CSF node 804 is between the CMA switch 806 and the bias voltage switch 808. One end of the CSF transistor 802 is connected to a third reset voltage supply 803 and the CSF transistor 802 isolates the GRS node 706 from the two injection capacitors 324 and 342. The isolation of the GRS node 706 keeps the node capacitance of the GRS node 706 much lower than the node capacitance of the second common node 305, and increases the overall voltage gain of the integrated background signal.

The parasitic capacitance of the GRS node 706 is limited to a sum of the source and drain capacitances of the GRS switch 704 and the OFG switch 304, the gate capacitance of the CSF switch 802, a source follower transistor, and parasitic capacitances.

The CSF transistor 802 is a voltage follower together with a bias current source and the two injection capacitors 324 and 342 are supplied a charging current by the supply, $V_{DD}$, directly and the settling time will be much faster.

Figure 9:
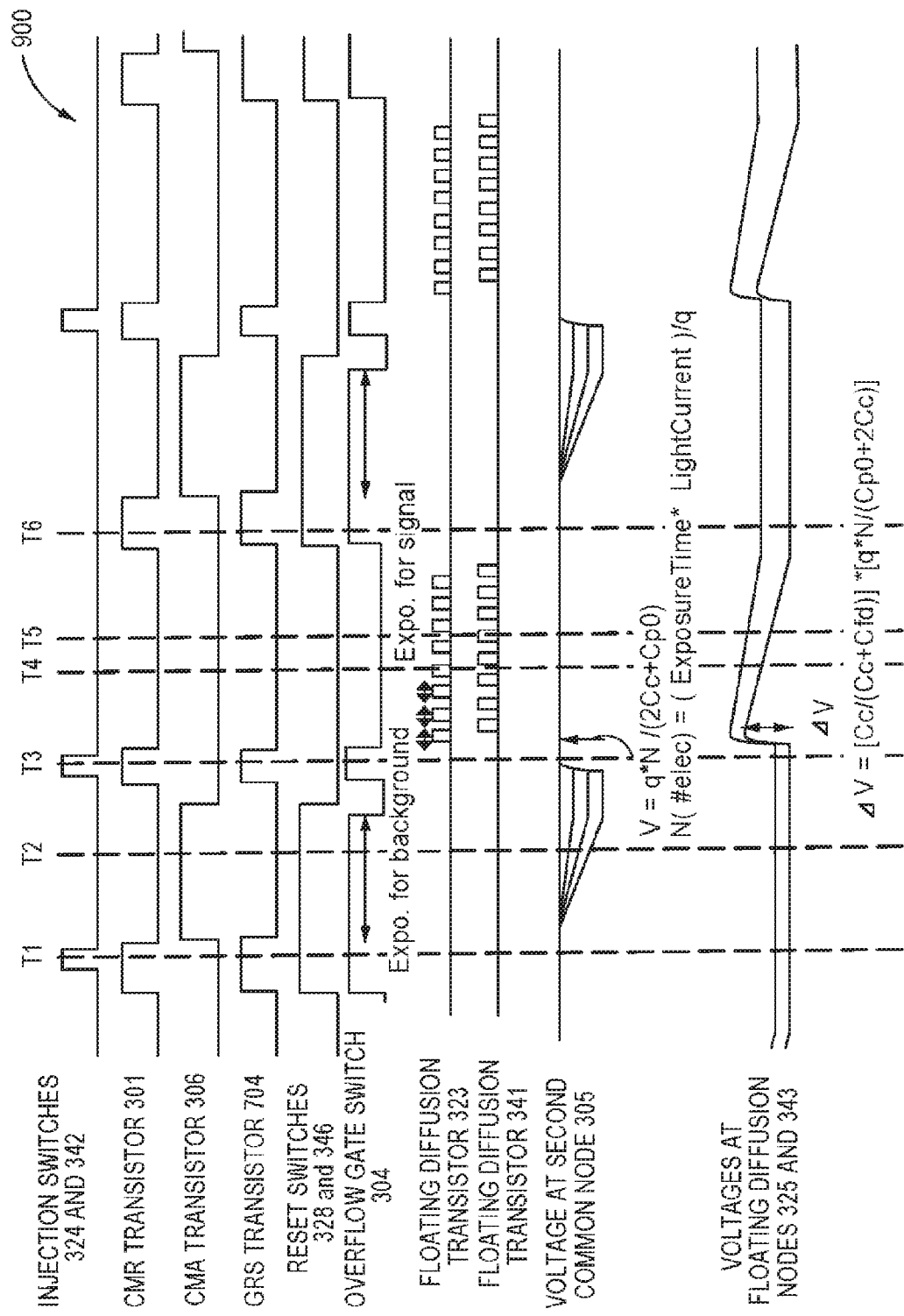
FIG. 9 is a timing diagram that illustrates operations of the pixel circuit of FIG. 8, in accordance with various aspects of the present disclosure.

FIG. 9 is a timing diagram 900 that illustrates operations of the pixel circuit 800 of FIG. 8, in accordance with various aspects of the present disclosure. In the example of FIG. 9, the timing diagram 900 is the almost the same as the timing diagram 400 as described above in FIG. 4, except for the addition of a control signal for the GRS switch 704 and a control signal the CMA switch 806. In the example of FIG. 9, during the first, third, and sixth time periods, the GRS switch 704 globally resets the photodiode 302 for both the background signal and reflected LED signal integrations. The CMA switch 806 is turned off when the background signal is boosted.

Figure 10:
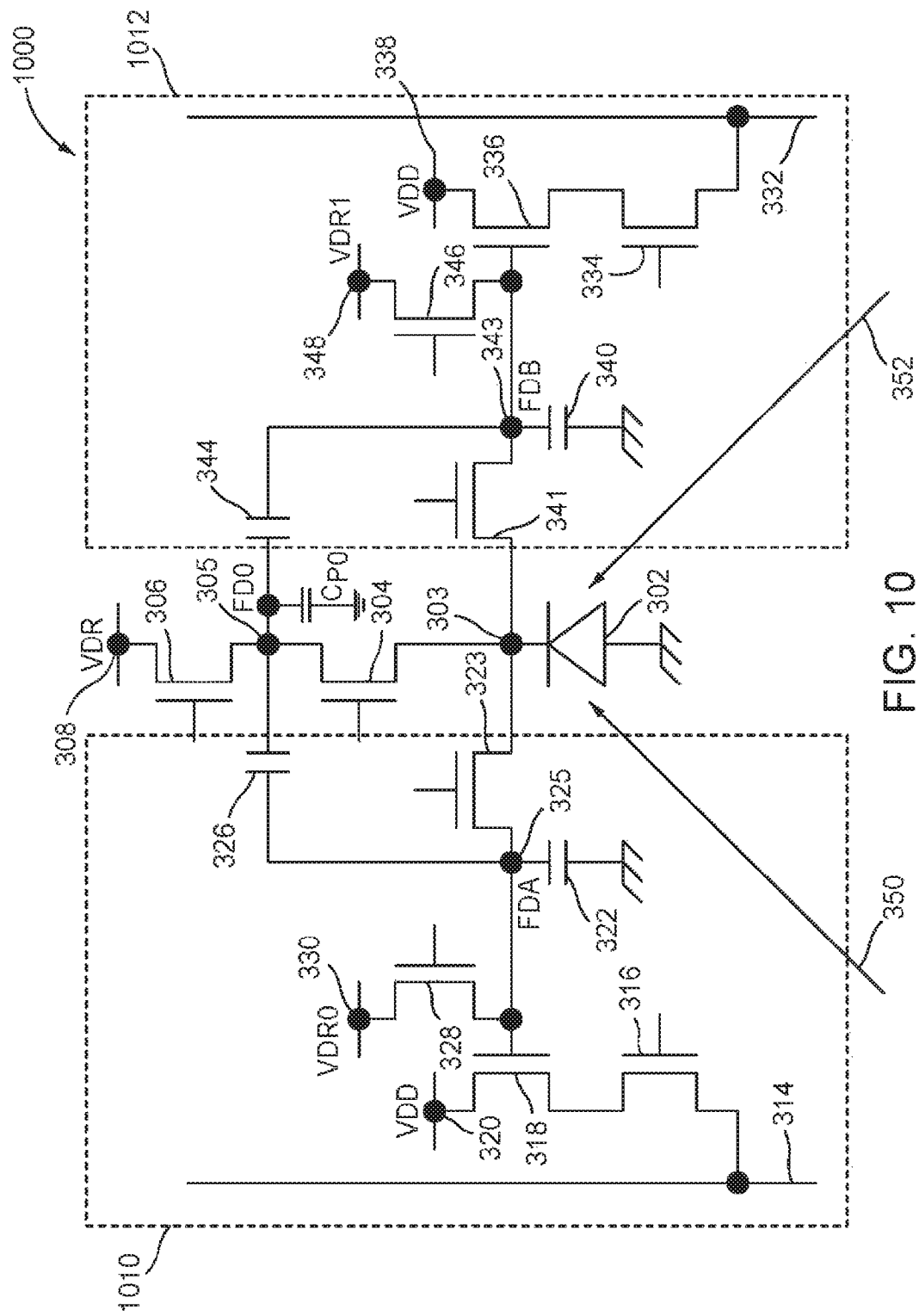
FIG. 10 is a circuit diagram that illustrates another pixel circuit, in accordance with various aspects of the present disclosure.

FIG. 10 is a circuit diagram that illustrates another pixel circuit 1000, in accordance with various aspects of the present disclosure. With respect to FIG. 1, the pixel circuit 1000 is one pixel of the array 110 of pixels 111 in the image sensor 100, for example, a Floating Diffusion Global Shutter (FDGS) sensor.

In the example of FIG. 10, the pixel circuit 1000 is similar to the pixel circuit 300 as described above in FIG. 3, except the pixel circuit 1000 does not include the two injections switches 324 and 342 and the two injection nodes 327 and 345. The pixel circuit 1000 includes the photodiode 302, a first common node 303, an overflow gate transistor 304, a second common node 305, a CMR transistor 306, a common reset voltage supply 308, a first tap 1010, and a second tap 1012. The overflow gate transistor 304 resets the photodiode 302 globally independent of a normal readout path the transfer gate. Since the first tap 1010 and the second tap 1012 share the photodiode 302 at the first common node 303, only a single overflow gate transistor is used in the pixel circuit 1000.

The first tap 1010 includes a first vertical signal line 314, a first selection transistor 316, a first amplification transistor 318, a first supply voltage 320, a first floating diffusion capacitor 322, a first floating diffusion transistor 323, a first floating diffusion node 325, a first injection capacitor 326, a first reset switch 328, and a first reset voltage supply 330. The first vertical line 314 is electrically connected to the column circuit 130. A source side of the first selection transistor 316 is electrically connected to the first vertical signal line 314, a drain side of the first selection transistor 316 is electrically connected to a source side of the first amplification transistor 318, and a gate of the first selection transistor 316 is electrically connected to the vertical driving circuit 120 and is controlled by the controller 150. A drain side of the first amplification transistor 318 is electrically connected to the first supply voltage 320. A gate of the first amplification transistor 318, one end of the first floating diffusion capacitor 322, one end of the first floating diffusion transistor 323, one end of the first injection capacitor 326, and one end of the first reset switch 328 are electrically connected to the first floating diffusion node 325. The other end of the floating diffusion capacitor 322 is electrically connected to ground. The other end of the first floating diffusion switch 323 is electrically connected to one end of the photodiode 302 at the first common node 303. The other end of the first injection capacitor 326 and a drain side of the overflow gate transistor 304 are electrically connected to the second common node 305. The other end of the first reset switch 328 is electrically connected to the first reset voltage supply 330.

The second tap 1012 includes a second vertical signal line 332, a second selection transistor 334, a second amplification transistor 336, a second supply voltage 338, a second floating diffusion capacitor 340, a second floating diffusion transistor 341, a second floating diffusion node 343, a second injection capacitor 344, a second reset switch 346, and a second reset voltage supply 348. The second tap 1012 mirrors the first tap 1010. As a consequence, the electrical connections of the second tap 1012 mirror the first tap 1010, and therefore, a description of the electrical connections of the second tap 1012 is omitted.

The photodiode 302 receives demodulated light 350 and background light 352. Over the course of various time periods, as explained in greater detail below, the photodiode 302 provides a charge based on the demodulated light 350 and the background light 352 to the two injection capacitors 326 and 344 and to the two floating diffusion capacitors 322 and 340 for storage and integration. In particular, the two injection capacitors 326 and 344 are used to store the charge from the photodiode 302, which is integrated from a background signal based on the background light 352, when the light source that emits a modulated light is turned off. Alternatively, in some examples, the two injection capacitors 326 and 344 may store a charge that is manually inserted externally (for example, a charge from the controller 150). During the subtraction of the background signal (described in greater detail below), the charge that is stored by the two injection capacitors 326 and 344 is injected into the corresponding two floating diffusion capacitors 322 and 340 through a serial circuit connection.

Figure 11:
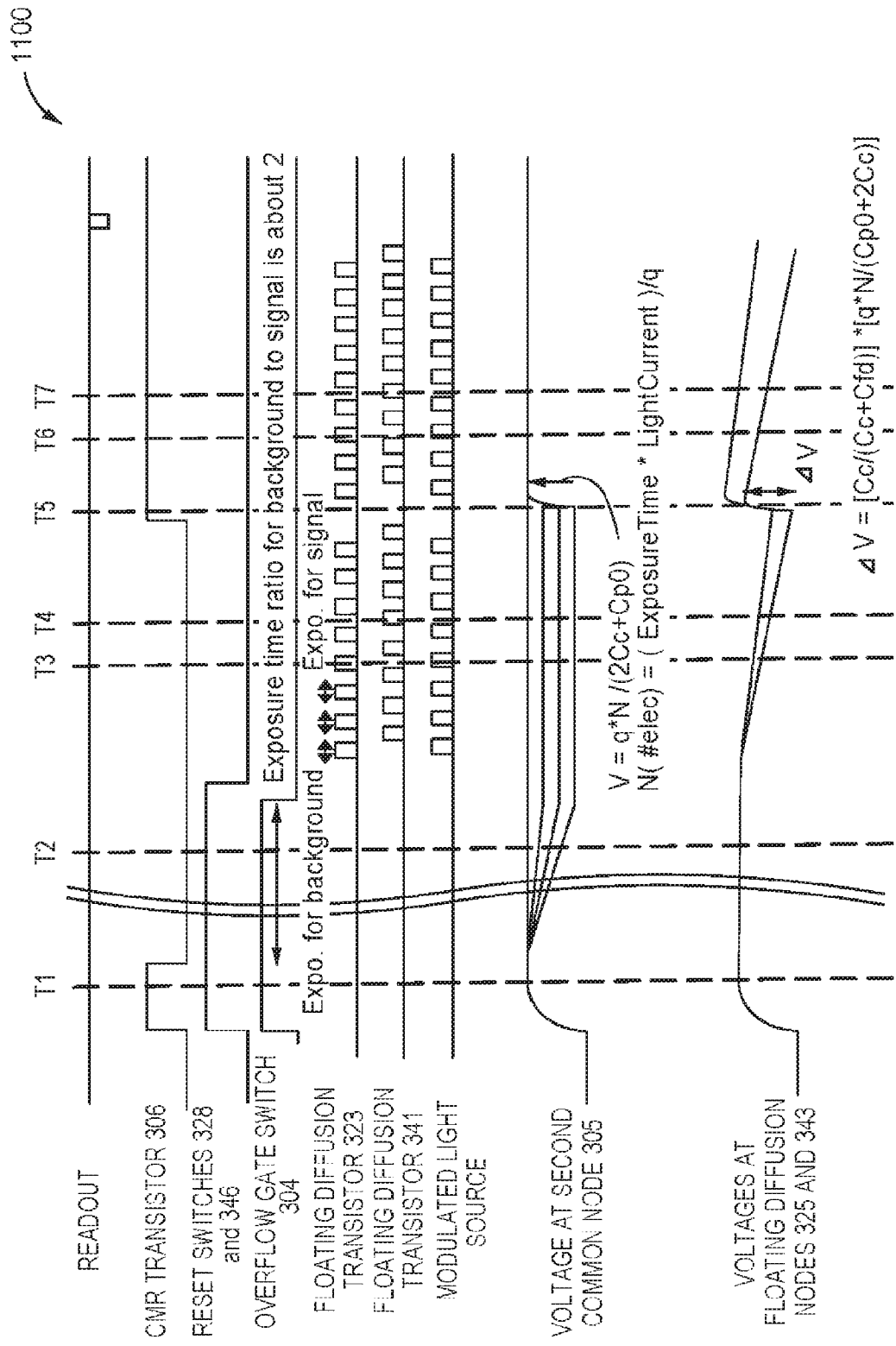
FIG. 11 is a timing diagram that illustrates operations of the pixel circuit of FIG. 10, in accordance with various aspects of the present disclosure.

FIG. 11 is a timing diagram 1100 that illustrates operations of the pixel circuit 800 of FIG. 10, in accordance with various aspects of the present disclosure. During the first time period T1 of the timing diagram 1100, both the floating diffusion nodes 325 and 343 as well as the photodiode 302 are reset. For example, the photodiode 302 is reset by turning on the CMR switch 306 and the OFG switch 304. Similarly, the two floating diffusion nodes 325 and 343 are reset by turning on the two reset switches 328 and 346. In some examples, the reset voltages of the two reset switches 328 and 346 are different from each other. In other examples, the reset voltage of the two reset switches 328 and 346 are the same. In some examples, reset voltages applied by the two reset switches 328 and 346 and the CMR switch 306 from the two reset voltage supplies 330 and 348 and the common reset voltage supply 308, respectively, are the same. In other examples, the reset voltages applied by the two reset switches 328 and 346 and the CMR switch 306 from the two reset voltage supplies 330 and 348 and the common reset voltage supply 308, respectively, are different from each other.

During the second time period T2, the CMR switch 306 is turned off and the OFG switch 304 remains in an ON state to transfer the charge integrated in the photodiode 302 to the two injection capacitors 326 and 344. Both of the reset switches remain in an ON state to hold the two floating diffusion nodes 325 and 343 to the reset voltage (for example, voltage $V_{DR0}$ and $V_{DR1}$, respectively). During the second time period T2, the light source that emits the modulated light is turned off. The background signal that is integrated by the photodiode 302 at the first common node 303 is shared and stored in the two injection capacitors 326 and 344 until the pixel circuit 1000 is ready to subtract the background signal from the two floating diffusion nodes 325 and 343.

During the third and fourth time periods T3 and T4, the two floating diffusion transistors 323 and 341 receive pulses that are alternately generated. The alternately generated pulses alternately turn ON and OFF the two floating diffusion transistors 323 and 341. By alternately turning ON and OFF the two floating diffusion transistors 323 and 341, the two floating diffusion nodes 325 and 343 integrate a combined signal at phases that are opposite to each other. During the third and fourth time periods T3 and T4, the light source that emits the modulated light is turned on and synchronized with the alternately generated pulses as described above.

During the fifth time period T5, the CMR switch is turned ON to boost the second common node 305 to the common supply voltage $V_{DD}$. The amount of boosted voltage is based on the background signal stored in the two injection capacitors 326 and 344. The boosted voltage injects the charge into the two floating diffusion nodes 325 and 343 through the two injection capacitors 326 and 343. During the fifth time period T5, the two floating diffusion transistors 323 and 341 remain off. The amount of charge injected into each of the two floating diffusion nodes 325 and 343 is based on a ratio of capacitances of each injection capacitor (e.g., either the first injection capacitor 326 or the second injection capacitor 344) and corresponding floating diffusion node (e.g., the corresponding first floating node 325 or the corresponding second floating diffusion node 343). With respect to the first tap 1010, the amount of charge is defined by Equation 5.

$$\text{Amount of charge} = C_{326}(C_{322} + C_{326}) * (V_{DR} - V_{FDO}) \quad (5)$$

In Equation 5, $C_{326}$ is the capacitance of the first injection capacitor 326, $C_{322}$ is the capacitance of the first floating diffusion capacitor 322, $V_{DR}$ is the voltage of the common reset voltage supply 308, and $V_{FDO}$ is the charge accumulated at the second common node 305.

During the seventh time period T7, the two floating diffusion transistors 323 and 341 again receive pulses that are alternately generated to continue integrating the demodulated charge, due to the subtraction of the background signal, at phases that are opposite to each other.

Upon completing the integration cycle, the voltage stored in each of the two floating diffusion nodes 325 and 343 is read out by the vertical driving circuitry 120 and digitally processed by the column circuit 130. Information regarding both in-phase and quadrature phase signals (or other phase signals in between, if more than four phase signals are implemented) is extracted from the voltages that are read out from the pixel circuit 1000. The information that is readout is used to calculate the distance from the light source to the object or from the object to the pixel circuit 1000 based on Equations 1 and 2 as described above.

In the example of FIG. 10, the pixel circuit 1000 is a single pixel in the array 110 of the pixels 111 of FIG. 1. The pixel circuit 1000 integrates the background signal based on the background light 352. With respect to FIG. 1, as all background signal integration is performed on a per pixel basis, the resultant signal level of the background signal will be different from pixel to pixel. However, the same integrated background signal from the photodiode 302 will be subtracted from both the first tap 1010 and the second tap 1012 because both the first and second taps 1010 and 1012 share the photodiode 302. One of the many advantages of the pixel circuit 1000 is the integration and subtraction of the background signal for all the pixels 111 in the array 110 is done globally. By performing the integration and subtraction of the background signal globally, there is no artifact caused due to the processing time lag among the array 110 of pixels 111.

In the example of FIG. 11, the boosting process and the background signal subtraction may be performed only once in every demodulated signal integration cycle. This limitation is caused by the need to reset second common node 305 and the two injection capacitors 326 and 344 in order to integrate the background signal. This limitation is also caused by the need to reset the two floating diffusion nodes 325 and 343, which resets the intermediate results stored in the two floating diffusion nodes 325 and 343.

Figure 12:
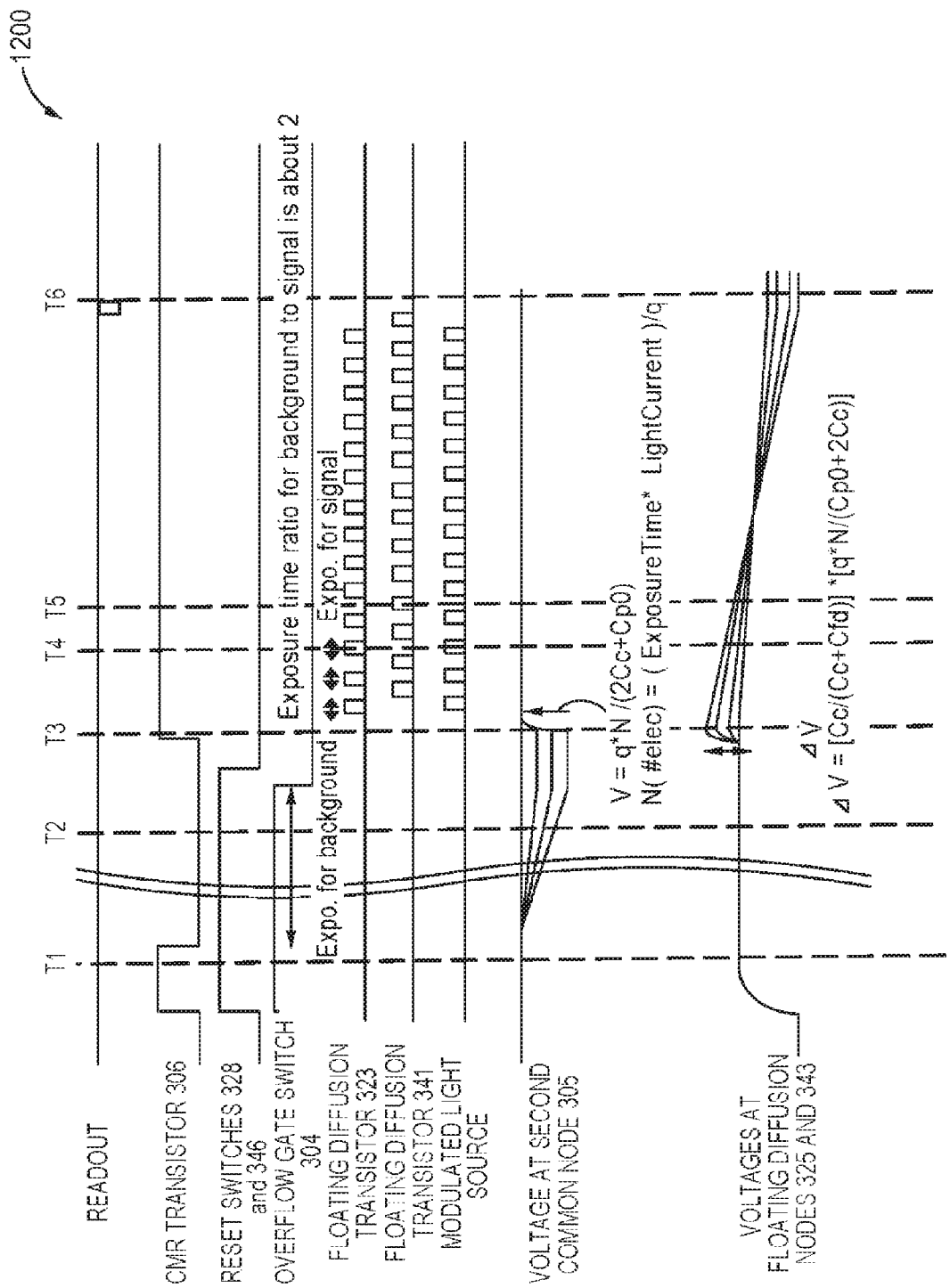
FIG. 12 is another timing diagram that illustrates operations of the pixel circuit of FIG. 10, in accordance with various aspects of the present disclosure.

FIG. 12 is another timing diagram 1200 that illustrates operations of the pixel circuit 800 of FIG. 10, in accordance with various aspects of the present disclosure. Both the timing diagram 1100 and the timing diagram 1200 illustrate the integration of the background signal before the integration of the demodulated signal. However, in the timing diagram 1100, the background signal stored in the two injection capacitors 326 and 344 is subtracted after the integration of the demodulated signal is started and also when the signal level of the demodulated signal is getting close to saturation. By comparison, in the timing diagram 1200, the background signal is pre-compensated (subtracted) before the start of the illumination by the light source (for example, a light-emitting diode (LED), a near-infrared LED, a laser diode (LD), or other suitable light source) and the integration of the demodulated signal.

In the example of FIG. 12, since the voltages at the two floating diffusion nodes 325 and 343 are boosted after the two floating diffusion nodes 325 and 343 are reset, the voltage level of the two floating diffusion nodes 325 and 343 go above the reset level which is either determined by the soft reset (for example, Vreset−Vt) or the voltage level set by the hard reset. Since the voltage level of the floating diffusion nodes 325 and 343 may pass beyond the common reset voltage provided by the common reset voltage supply 308, one characteristic of the transistor or transistors (for example, the two amplification transistors 318 and 336, the two floating diffusion transistors 323 and 341, and the two reset switches 328 and 346) must include a tolerance to the boosted voltage. By selecting a transistor with a tolerance to the boosted voltage, the dynamic ranges of the two floating diffusion nodes 325 and 343 are extended by the maximum voltage boosted.

For example, normally the dynamic range of each floating diffusion node is determined by a difference between the reset voltage and a saturation voltage, i.e., Vreset-Vsat. However, in the example of FIG. 12, the dynamic range of each floating diffusion node is a difference between the reset voltage and a saturation voltage with the addition of the boost voltage, i.e., Vreset−Vsat+Vboost. After the integration of the demodulated signal 350, the voltage level in the floating diffusion nodes 325 and 343 is below the reset voltage, which is within the input dynamic range of the readout circuit including the analog-to-digital converter (ADC).

During the first time period T1, the photodiode 302 is reset by turning ON the CMR switch 306 and the OFG switch 304. Similarly, the two floating diffusion nodes 325 and 343 are reset by turning on the two reset switches 328 and 346. In some examples, the reset voltages of the two reset switches 328 and 346 may be different. In other examples, the reset voltages of the two reset switches 328 and 346 may be the same.

During the second time period T2, the CMR switch 306 is turned OFF and the OFG switch 304 remains ON to transfer the charge of the background signal that is integrated in the photodiode 302 to the two injection capacitors 326 and 344. At this time, both of the reset switches 328 and 346 remain ON and hold the voltages of the two floating diffusion nodes 325 and 343 to the reset voltage. The background signal is integrated by the photodiode 302 and is shared and stored in the two injection capacitors 326 and 344 until the pixel circuit 300 is ready to subtract the background signal from the two floating diffusion nodes 325 and 343.

During the third time period T3, the CMR switch 306 is turned ON and boosts the common node voltage $V_{FD0}$ node to the common supply voltage $V_{DR}$. The amount of boosted voltage is based on the background signal stored in the two injection capacitors 326 and 344 ($V_{DR}$-$V_{FDO}$). At this time, the boosted voltage injects the charge from the two injection capacitors 326 and 344 into the two floating diffusion nodes 325 and 343. The amount of charge injected into each of the two floating diffusion nodes 325 and 343 is based on a ratio of capacitances of each injection capacitor (e.g., either the first injection capacitor 326 or the second injection capacitor 344) and corresponding floating diffusion node (e.g., the corresponding first floating node 325 or the corresponding second floating diffusion node 343).

During the fourth and fifth time periods T4 and T5, the modulated light pulse starts with respect to the modulated light source, and the photodiode 302 integrates electrons generated by the demodulated light. At this time, the two floating diffusion transistors 323 and 341 receive pulses that alternately generated to transfer the integrated charge of the photodiode 302 to the two floating diffusion nodes 325 and 343.

During the sixth time period T5, the voltages at the two floating diffusion nodes 325 and 343 are readout. For example, the controller 150 as described above in FIG. 1 may read out the voltages from the two floating diffusion noes 325 and 343.

With respect to FIGS. 3, 7, 8, and 10 a requirement for the injection capacitors, especially for pixel circuit with a small size, the size of the injection capacitors has to be small and with minimal capacitance variation over the operating voltage, temperature, and process. Additionally, the parasitic capacitance also needs to be small compared the main capacitance of the injection capacitors to prevent the parasitic capacitance from affecting the charge storage and injection of the charge into the floating diffusions. One suitable capacitor for a backside illuminated (BSI) photodiode application is a metal-insulator-metal (MiM) capacitor because the variation over process, voltage, temperature (PVT) is reasonable and the parasitic capacitance is controllable. Another suitable capacitor for a BSI photodiode application is a metal-to-metal capacitor (MoM) where a stacked metal-to-metal capacitance is used. However, the MoM capacitor is generally larger and more expensive than the MiM capacitor, and the parasitic capacitance of the MoM is not as controllable when compared to the MiM capacitor. For front-side illuminated (FSI) photodiode application, either a MOSCAP (or CI) capacitor is more suitable than the MiM or the MoM type capacitors. Advantages of the MOSCAP type capacitors include large capacitance per unit area (e.g., ~4 fF/umsq for a process that supports above 1.8V of operating voltage) and the MOSCAP type capacitor does not affect the optical performance of the photodiode. However, the MOSCAP type capacitor does have an intrinsic capacitance between the diffusion and well, as well as a higher capacitance variation over PVT than the MiM and MoM capacitor types.

With respect to FIGS. 4, 6, 9, 11, and 12, the voltage level of the second common node 305 during the injection of the charge of the background signal is defined by Equation 6.

$$V = q*N/(C_{326}+C_{344}+Cp0) \qquad (6)$$

In Equation 6, N is a number of electrons received by the photodiode 302, which is equal to exposure time of the photodiode 302 multiplied by light current and further divided by q, i.e., N=(ExposureTime*LightCurrent)/q. In Equation 6, Cp0 is a parasitic capacitance at the second common node 305.

Additionally, with respect to FIGS. 4, 6, 9, 11, and 12, a difference between the voltage levels of the two floating diffusion nodes 325 and 343 during the injection of the charge of the background signal is defined by Equation 7.

$$\Delta V = [C_{326/344}/(C_{326/344}+C_{322/340})]*[q*N/(Cp0+2C_{326/344})] \qquad (7)$$

In Equation 7, N is a number of electrons received by the photodiode 302, which is equal to exposure time of the photodiode 302 multiplied by light current and further divided by q, i.e., N=(ExposureTime*LightCurrent)/q. In Equation 7, Cp0 is an intrinsic capacitance at the second common node 305.

With respect to FIGS. 3 and 10, the power consumption by the pixel circuits 300 and 1000, respectively, is less than 1 mW because each pixel circuit is discharging and charging a parasitic capacitance. With respect to FIGS. 7 and 8, the power consumption by the pixel circuits 700 and 800, respectively, is greater than 1 mW because each pixel circuit includes an amplifier. In some examples, the amplifier may consume 0.2 μA and three volts (V), and the power consumption across an image sensor with a VGA resolution is approximately one hundred and eighty-four milliwatts (mW).

Conclusion

With regard to the processes, systems, methods, heuristics, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain examples, and should in no way be construed so as to limit the claims.

Accordingly, it is to be understood that the above description is intended to be illustrative and not restrictive. Many examples and applications other than the examples provided would be apparent upon reading the above description. The scope should be determined, not with reference to the above description, but should instead be determined with reference to the appended claims, along with the full scope of equivalents to which the claims are entitled. It is anticipated and intended that future developments will occur in the technologies discussed herein, and that the disclosed systems and methods will be incorporated into such future embodiments. In sum, it should be understood that the application is capable of modification and variation.

All terms used in the claims are intended to be given their broadest reasonable constructions and their ordinary meanings as understood by those knowledgeable in the technologies described herein unless an explicit indication to the contrary is made herein. In particular, use of the singular articles such as "a," "the," "said," etc. should be read to recite one or more of the indicated elements unless a claim recites an explicit limitation to the contrary.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it may be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

The invention claimed is:

1. A pixel circuit comprising:
   an overflow gate transistor electrically connected to a node and a second node;
   a photodiode electrically connected to the node and a chassis ground, the photodiode is configured to
      receive background light,
      receive a combination of the background light and a demodulated light that is generated by a modulated light source and reflected from an object,
      integrate a background signal based on the background light that is received, and
      integrate a combined signal based on the combination of the background light and the demodulated light;
   an analog buffer electrically connected to the second node and a third node and isolates a capacitance of the third node from a capacitance of the second node; and
   two taps, each tap of the two taps is configured to
      store the background signal that is integrated,
      subtract the background signal from a floating diffusion,
      store the combined signal that is integrated at the floating diffusion, and
      generate a demodulated signal based on a subtraction of the background signal from the floating diffusion and a storage of the combined signal that is integrated at the floating diffusion.

2. The pixel circuit of claim 1, further comprising:
   a common reset voltage supply configured to supply a common reset voltage; and
   a CMR transistor electrically connected to the common reset voltage supply and the second node,
   wherein the each tap of the two taps is further configured to isolate the floating diffusion from the background signal that is stored.

3. The pixel circuit of claim 2, wherein the each tap of the two taps includes
   a selection transistor electrically connected to a selection line,
   a tap drain voltage supply configured to supply a tap drain voltage,
   an amplification transistor electrically connected to the selection transistor, the tap drain voltage supply, and a floating diffusion node,
   a floating diffusion transistor electrically connected to the floating diffusion node and the node,
   a floating diffusion capacitor electrically connected to the floating diffusion node and the chassis ground,
   an injection switch electrically connected to the floating diffusion node and an injection node,
   an injection capacitor electrically connected to the second node and the injection node,
   a reset voltage supply configured to supply a reset voltage, and
   a reset switch electrically connected to the reset voltage supply and the injection node, and
   wherein the floating diffusion comprises the floating diffusion capacitor and the floating diffusion node.

4. The pixel circuit of claim 3, wherein the background signal that is stored by the each tap is stored in the injection capacitor and the injection node, and wherein, to store the background signal that is integrated, the each tap of the two taps is configured to receive the background signal that is integrated from the photodiode via the overflow gate transistor while the CMR transistor and the injection switch are in an OFF state and while the reset switch and the overflow gate transistor are in an ON state.

5. The pixel circuit of claim 3, wherein, to isolate the floating diffusion from the background signal that is stored, the each tap of the two taps is configured to set a state of the injection switch to an OFF state.

6. The pixel circuit of claim 3, wherein, to subtract the background signal from the floating diffusion, the each tap of the two taps is configured to set a state of the injection switch to an ON state.

7. The pixel circuit of claim 3, wherein, to store the combined signal that is integrated, the each tap of the two taps is configured to receive the combined signal that is integrated from the photodiode via the floating diffusion transistor while the CMR transistor, the injection switch, the reset switch, and the overflow gate transistor are in an OFF state,
    wherein a first floating diffusion transistor of a first tap of the two taps and a second floating diffusion transistor of a second tap of the two taps are alternately set to an ON state or an OFF state,
    wherein the first floating diffusion transistor is set to the ON state while the second floating diffusion transistor is set to the OFF state, and
    wherein the first floating diffusion transistor is set to the OFF state while the second floating diffusion transistor is set to the ON state.

8. The pixel circuit of claim 2, further comprising:
    a GRS transistor electrically connected to the common reset voltage supply and the third node,
    wherein the overflow gate transistor is electrically connected to the third node,
    wherein the each tap of the two taps includes
        a selection transistor electrically connected to a selection line,
        a tap drain voltage supply configured to supply a tap drain voltage,
        an amplification transistor electrically connected to the selection transistor, the tap drain voltage supply, and a floating diffusion node,
        a floating diffusion transistor electrically connected to the floating diffusion node and the node,
        a floating diffusion capacitor electrically connected to the floating diffusion node and the chassis ground,
        an injection switch electrically connected to the floating diffusion node and an injection node,
        an injection capacitor electrically connected to the second node and the injection node,
        a reset voltage supply configured to supply a reset voltage, and
        a reset switch electrically connected to the reset voltage supply and the injection node, and
    wherein the floating diffusion comprises the floating diffusion capacitor and the floating diffusion node.

9. The pixel circuit of claim 8, wherein the background signal that is stored by the each tap is stored in the injection capacitor and the injection node, and wherein, to store the background signal that is integrated, the each tap of the two taps is configured to receive the background signal that is integrated from the photodiode via the overflow gate transistor while the CMR transistor and the injection switch are in an OFF state and while the reset switch and the overflow gate transistor are in an ON state.

10. The pixel circuit of claim 8, wherein, to isolate the floating diffusion from the background signal that is stored, the each tap of the two taps is configured to set a state of the injection switch to an OFF state.

11. The pixel circuit of claim 8, wherein, to subtract the background signal from the floating diffusion, the each tap of the two taps is configured to set a state of the injection switch to an ON state.

12. The pixel circuit of claim 8, wherein, to store the combined signal that is integrated, the each tap of the two taps is configured to receive the combined signal that is integrated from the photodiode via the floating diffusion transistor while the CMR transistor, the injection switch, the reset switch, and the overflow gate transistor are in an OFF state,
    wherein a first floating diffusion transistor of a first tap of the two taps and a second floating diffusion transistor of a second tap of the two taps are alternately set to an ON state or an OFF state,
    wherein the first floating diffusion transistor is set to the ON state while the second floating diffusion transistor is set to the OFF state, and
    wherein the first floating diffusion transistor is set to the OFF state while the second floating diffusion transistor is set to the ON state.

13. The pixel circuit of claim 2, further comprising:
    a CSF transistor electrically connected to the common reset voltage supply, the third node, and a fourth node;
    a CMA transistor electrically connected to the fourth node and the second node;
    a voltage bias transistor electrically connected to the fourth node and the chassis ground;
    a GRS transistor electrically connected to the common reset voltage supply and the third node,
    wherein the overflow gate transistor is electrically connected to the third node, and
    wherein the each tap of the two taps includes
        a selection transistor electrically connected to a selection line,
        a tap drain voltage supply configured to supply a tap drain voltage,
        an amplification transistor electrically connected to the selection transistor, the tap drain voltage supply, and a floating diffusion node,
        a floating diffusion transistor electrically connected to the floating diffusion node and the node,
        a floating diffusion capacitor electrically connected to the floating diffusion node and the chassis ground,
        an injection switch electrically connected to the floating diffusion node and an injection node,
        an injection capacitor electrically connected to the second node and the injection node,
        a reset voltage supply configured to supply a reset voltage, and
        a reset switch electrically connected to the reset voltage supply and the injection node, and
    wherein the floating diffusion comprises the floating diffusion capacitor and the floating diffusion node.

14. The pixel circuit of claim 13, wherein the background signal that is stored by the each tap is stored in the injection capacitor and the injection node, and wherein, to store the background signal that is integrated, the each tap of the two taps is configured to receive the background signal that is integrated from the photodiode via the overflow gate transistor while the CMR transistor and the injection switch are in an OFF state and while the reset switch and the overflow gate transistor are in an ON state.

15. The pixel circuit of claim 13, wherein, to store the combined signal that is integrated, the each tap of the two taps is configured to receive the combined signal that is integrated from the photodiode via the floating diffusion transistor while the CMR transistor, the injection switch, the reset switch, and the overflow gate transistor are in an OFF state,
    wherein a first floating diffusion transistor of a first tap of the two taps and a second floating diffusion transistor of a second tap of the two taps are alternately set to an ON state or an OFF state, wherein the first floating diffusion transistor is set to the ON state while the second floating diffusion transistor is set to the OFF state, and wherein the first floating diffusion transistor is set to the OFF state while the second floating diffusion transistor is set to the ON state.

16. The pixel circuit of claim 1, wherein the each tap of the two taps is further configured to
receive a correction signal from an external source,
subtract the correction signal from the floating diffusion, and
generate a second demodulated signal based on a subtraction of the correction signal from the floating diffusion and the storage of the combined signal that is integrated at the floating diffusion.

17. The pixel circuit of claim 1, wherein, to generate the demodulated signal based on the subtraction of the background signal from the floating diffusion and the storage of the combined signal that is integrated at the floating diffusion, the each tap of the two taps is configured to generate the demodulated signal over multiple cycles until a signal level of the demodulated signal reaches a predetermined level.

18. The pixel circuit of claim 17, wherein the predetermined level is approximately a saturation level of the floating diffusion.

19. A method for performing a pixel-level background light subtraction, the method comprising:
integrating, with a photodiode of a pixel circuit, a background signal based on background light received by the photodiode;
storing a charge of the background signal that is integrated in injection capacitors of the pixel circuit;
subtracting the charge that is stored in the injection capacitors from floating diffusions of the pixel circuit;
integrating, with the photodiode, a combined signal based on a combination of background light and demodulated light received by the photodiode;
storing charges of the combined signal in the floating diffusions; and
reading out a demodulated signal from each the floating diffusions, wherein the demodulated signal is a difference between the charge of the combined signal and the charge of the background signal that is stored at the each of the floating diffusions, and wherein the demodulated signal from the each of the floating diffusions has a different phase,
wherein the pixel circuit further includes
an overflow gate transistor electrically connected to a first node and a second node,
an analog buffer electrically connected to the second node and a third node and isolates a capacitance of the third node from a capacitance of the second node, and
the photodiode is electrically connected to the first node and a chassis ground.

20. The method of claim 19, wherein reading out the demodulated signal from the each of the floating diffusions further includes
determining whether a signal level of the demodulated signal in the each of the floating diffusions is at a predetermined level;
responsive to determining that the signal level of the demodulated signal in the each of the floating diffusions is at or exceeds the predetermined level, reading out the demodulated signal from the each of the floating diffusions; and
responsive to determining that the signal level of the demodulated signal in the each of the floating diffusions is below the predetermined level, repeating the method of claim 19.

21. An imaging device comprising:
a controller; and
an array of pixels including at least one pixel circuit that includes
an overflow gate transistor electrically connected to a node and a second node;
a photodiode electrically connected to the node and a chassis ground, the photodiode is configured to
receive background light,
receive a combination of the background light and a demodulated light that is generated by a modulated light source and reflected from an object,
integrate a background signal based on the background light that is received, and
integrate a combined signal based on the combination of the background light and the demodulated light;
an analog buffer electrically connected to the second node and a third node and isolates a capacitance of the third node from a capacitance of the second node; and
two taps, each tap of the two taps is configured to
store the background signal that is integrated,
subtract the background signal from a floating diffusion,
store the combined signal that is integrated at the floating diffusion, and
generate a demodulated signal based on a subtraction of the background signal from the floating diffusion and a storage of the combined signal that is integrated at the floating diffusion.

* * * * *